United States Patent
Kawata

(10) Patent No.: US 9,330,212 B2
(45) Date of Patent: May 3, 2016

(54) RECORDING MEDIUM IN WHICH CIRCUIT SIMULATOR PROGRAM IS STORED, AND DEVICE AND METHOD FOR GENERATING EYE PATTERN

(75) Inventor: Hikoyuki Kawata, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 983 days.

(21) Appl. No.: 13/531,946

(22) Filed: Jun. 25, 2012

(65) Prior Publication Data

US 2013/0041645 A1  Feb. 14, 2013

(30) Foreign Application Priority Data

Aug. 8, 2011 (JP) ................................. 2011-172806

(51) Int. Cl.
*G06F 17/50* (2006.01)
(52) U.S. Cl.
CPC ........ *G06F 17/5036* (2013.01); *G06F 17/5009* (2013.01); *G06F 17/5022* (2013.01)
(58) Field of Classification Search
CPC . G06F 17/5036; G06F 17/50; G06F 17/5009; G06F 17/5031; G06F 17/5068; G06F 17/5022
USPC ...................................................... 703/14, 13
See application file for complete search history.

(56) References Cited

U.S. PATENT DOCUMENTS

| | | | |
|---|---|---|---|
| 6,961,745 B2 | 11/2005 | Laquai | |
| 2005/0273740 A1* | 12/2005 | Tokuda | G06F 17/5036 716/113 |
| 2009/0086522 A1* | 4/2009 | Hiraishi | G11C 5/04 365/63 |

FOREIGN PATENT DOCUMENTS

JP  2002-368827  12/2002

OTHER PUBLICATIONS

Guo, Wei-Da et al., "Fast Methodology for Determining Eye Diagram Characteristics of Lossy Transmission Lines", Feb. 2009, IEEE Transactions on Advanced Packaging, vol. 32, No. 1, IEEE.*
Li, Chung-Sheng et al., "Fully Differential Optical Interconnections for High-Speed Digital Systems", Jun. 1993, IEEE Transactions on Very Large Scale Integration (VLSI) Systems, vol. 1, No. 2, IEEE.*
Shiue, Guang-Hwa et al. "Guard Trace Design for Improvement on Transient Waveforms and Eye Diagrams of Serpentine Delay Lines", Nov. 2010, IEEE Transactions on Advanced Packaging, vol. 33, No. 4, IEEE.*

* cited by examiner

*Primary Examiner* — Kamini S Shah
*Assistant Examiner* — Cedric D Johnson
(74) *Attorney, Agent, or Firm* — Fujitsu Patent Center

(57) ABSTRACT

An eye pattern is generated by: simulating a rising step response to a rising step signal input into the circuit and a falling step response to a falling step signal input into the circuit; analyzing a result of the simulating of the rising step response and the falling step response; generating, on the basis of a result of the analyzing, an upper-part test pattern that defines a shape of an upper part of an eye of an eye pattern and a lower-part test pattern that defines a shape of a lower part of the eye of the eye pattern; and simulating a response to the upper-part test pattern and the lower-part test pattern both input into the circuit. This procedure rapidly generates a precise eye pattern.

20 Claims, 27 Drawing Sheets

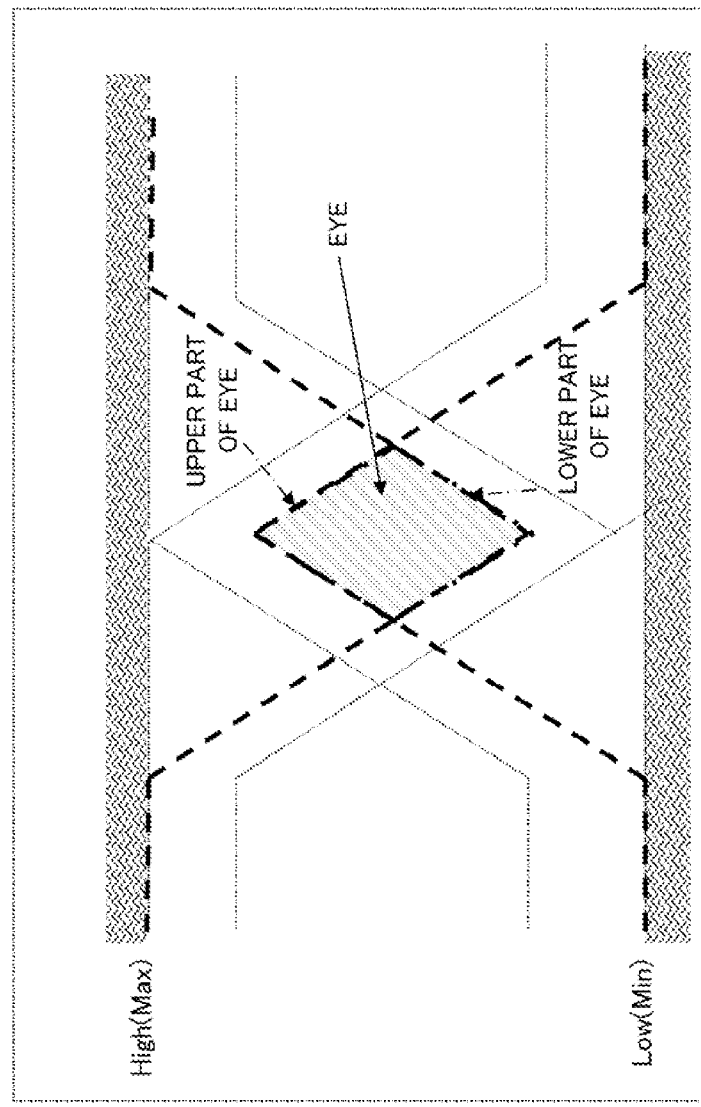

FIG. 11A

EXAMPLE OF TABLE STORING
ANALYZED RESULT WAVEFORM

| DEFINITION | VALUE |
|---|---|
| DERIVER NAME | DV1 |
| RECEIVER NAME | RV1 |
| UP OR DOWN | Up |
| NODE NAME OF OBSERVATION POINT | RV1_PIN (N2) |

FIG. 11B

EXAMPLE OF TABLE STORING
ANALYZED RESULT WAVEFORM

| TIME [ps] | VOLTAGE [V] |
|---|---|
| 0 | 0 |
| 10 | 0 |
| 20 | 0 |
| 30 | 0 |
| ... | |
| 300 | 1.5 |
| 310 | 1.6 |
| ... | |
| ... | |
| 1000 | 3.3 |
| ... | |
| ... | |

D14: REFLECTION ALLOWABLE VOLTAGE
D32: RESULT OF ANALYZING RISING STEP RESPONSE (RESPONSE WAVEFORM)
D33: RESULT OF ANALYZING FALLING STEP RESPONSE (RESPONSE WAVEFORM)
D41: RISING START TIME
D42: FALLING START TIME
D43: DC VOLTAGE IN HIGH STATE
D44: DC VOLTAGE IN LOW STATE

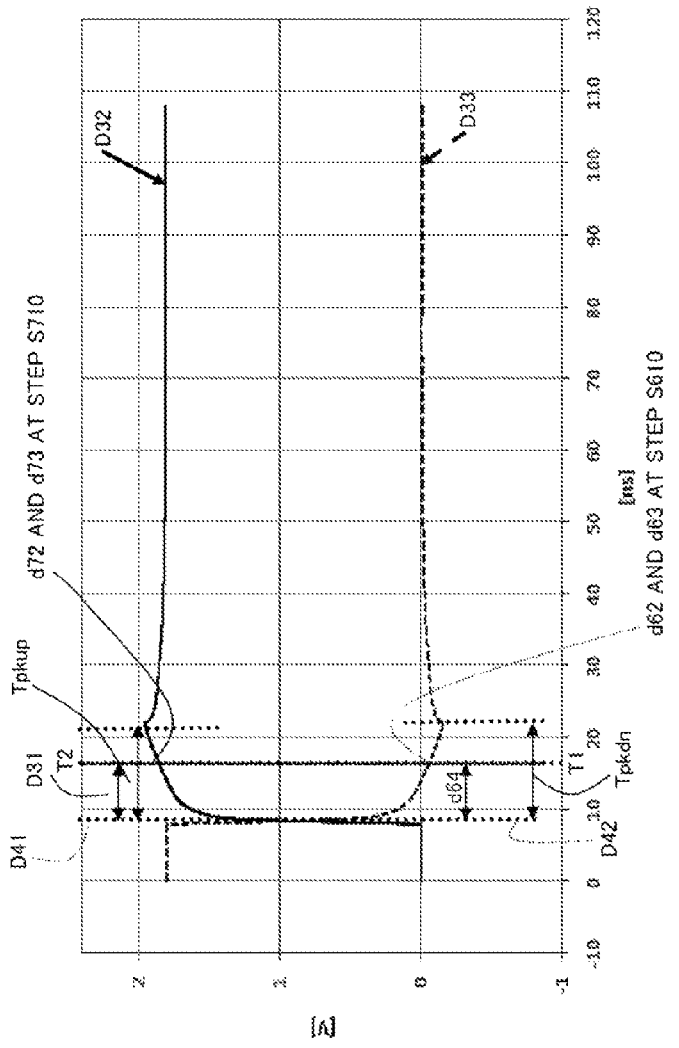

SIMULATION RESULT D62

SIMULATION RESULT D72

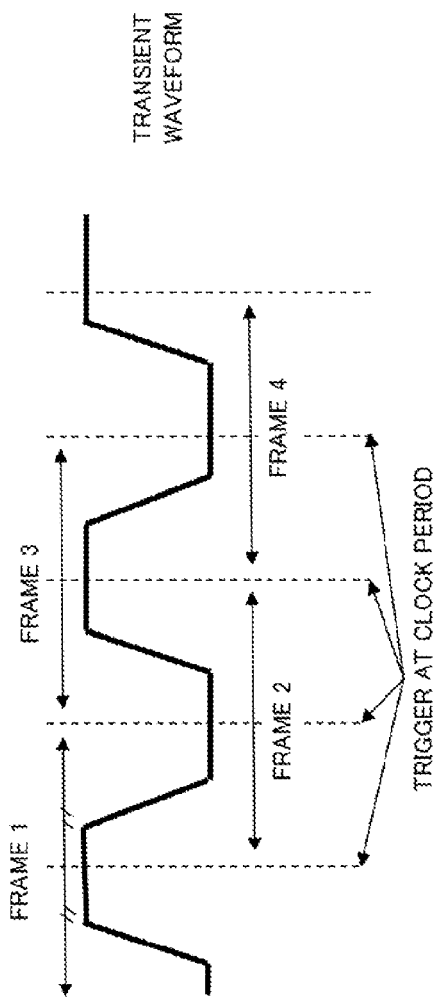
FIG. 26A
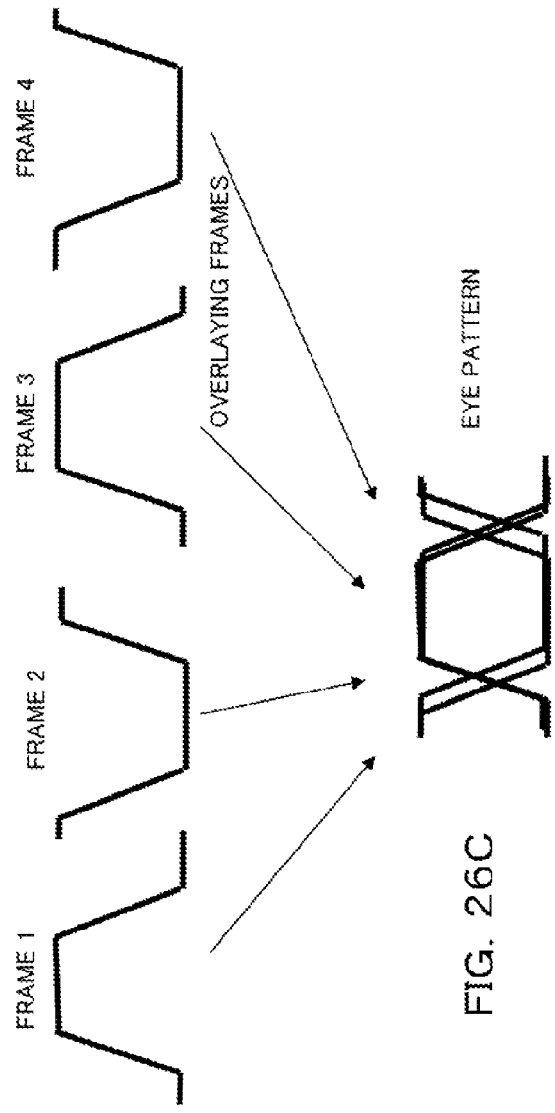
FIG. 26B
FIG. 26C

RECORDING MEDIUM IN WHICH CIRCUIT SIMULATOR PROGRAM IS STORED, AND DEVICE AND METHOD FOR GENERATING EYE PATTERN

CROSS-REFERENCE TO RELATED APPLICATION

This application is based upon and claims the benefit of priority of the prior Japanese Application No. 2011-172806 filed on Aug. 8, 2011 in Japan, the entire contents of which are hereby incorporated by reference.

FIELD

The embodiment discussed herein is a recording medium in which a circuit simulator program is stored, and a device for and a method of generating an eye pattern.

BACKGROUND

An eye pattern is graphical displaying of overlaid a large number of sampled transitions of a signal waveform. Specifically, as depicted in FIG. 25, an eye pattern is waveforms which are sampled from a transient waveform and which are overlaid on one another, and is used for determination on capability of high-speed transmission. FIG. 25 depicts an example of a typical eye pattern.

A manner of drawing an eye pattern will now be described with reference to accompanying drawings 26A-26C. FIG. 26A depicts an example of a transient waveform; FIG. 26B depicts waveforms sampled in units of a frame from the transient waveform of FIG. 26A; and FIG. 26C depicts an eye pattern obtained by overlaying the waveforms sampled in units of a frame with one another.

In order to draw an eye pattern of a transient waveform as depicted in FIG. 26A, a number of frames of the transient waveform are defined such that each frame has the same width in the forward and the reverse directions from the middle point of the frame, which corresponds to a trigger of the clock period. FIG. 26A depicts four frames 1-4. Each frame region is set to be slightly wider than the signal width for one bit, so that contiguous two frames partially overlap with each other.

The waveform of each frame defined as the above is sampled from the transient waveform depicted in FIG. 26A. FIG. 26B depicts examples of waveforms sampled from such frames 1-4.

Then the waveforms sampled in units of a frame are overlaid on the basis of the timing of the trigger as illustrated in FIG. 26B, and thereby an eye pattern of FIG. 26C is drawn.

Referring to the eye pattern drawn in the above manner, the quality of a waveform can be determined and confirmed in the following manner.

If a number of waveforms in the eye pattern are overlaying with one another at the same point (i.e., the same timing), the width of the waveforms constituting an eye pattern is thin and the center (inner shape) of the eye pattern is widely open. This state is called "the eye is open". If the eye of an eye pattern of waveform to be determined is open, the waveform to be determined is determined to be good in quality.

Conversely, if the positions (timings) of a number of waveforms differ from one another, the width of the waveforms constituting an eye pattern is thick and the center (inner shape) of the eye pattern is closed. This state is called "the eye is closed". If the eye of an eye pattern of waveform to be determined is closed, the object circuit is incapable of signal transmission and the waveform to be determined is determined to be poor in quality.

Generally, a requisite opening degree of an eye (inside of an eye pattern) is defined for each standard of a transmission signal to be determined. If the eye of an eye pattern obtained on an object circuit to be determined is below the defined size, the object circuit is not certificated to satisfy the standard. Examples of a standard of a transmission signal are Universal Serial Bus (USB), Peripheral Component Interconnect (PCI)-Express, and Double Data Rate (DDR) memory.

Here, a normal procedure of generating an eye pattern through simulation will be detailed along a flow diagram (steps S1 and S2) of FIG. 27. Previously to the simulation, circuit data related to an object circuit and test patterns of an input pulse are stored in a database D1 and a database D2, respectively.

The waveforms output from the object circuit in response to inputting a test pattern stored in the database D2 is obtained through a circuit simulation based on the circuit data stored in the database D1 (step S1). In succession, an eye pattern of the waveform obtained in the circuit simulation is generated in the above manner described with reference to FIGS. 26A-26C, and is then displayed on the monitor (step S2).

Recent transmission speed is increasing to make it important to confirm the quality of a waveform using an eye pattern. In particular, in conformation of waveform quality, the inner shape of an eye pattern, that is the shape of the eye, plays an important roll. For this reason, a demand arises to efficiently obtain the inner shape of an eye pattern through a simulation.

However, the inner shape of an eye pattern fluctuates complexly due to inter-symbol interference depending on a bit pattern of an input signal, transmission loss, and multiple reflection in combination of one another. A test pattern that causes the worst case of the inner shape of an eye pattern differs with a circuit condition of an object circuit. For the above, in order to obtain the precise inner shape of an eye pattern (eye shape), various test patterns are input into an object circuit and waveforms responsive to the input of the test patterns are simulated, which takes a long time.

SUMMARY

According to a first aspect of the embodiments, there is provided a computer-readable recording medium in which a circuit simulator program of a simulation of a circuit using design data of the circuit is stored, the program instructing a computer to execute a process comprising: simulating a rising step response to a rising step signal input into the circuit; simulating a falling step response to a falling step signal input into the circuit; analyzing a result of the simulating of the rising step response and the falling step response; generating, on the basis of a result of the analyzing, an upper-part test pattern that defines a shape of an upper part of an eye of an eye pattern and a lower-part test pattern that defines a shape of a lower part of the eye of the eye pattern; and simulating a response to the upper-part test pattern and the lower-part test pattern both input into the circuit.

As a second aspect of the embodiments, there is provided a device that executes a simulation of a circuit using design data of the circuit, the device including: a simulator that simulates a rising step response to a rising step signal input into the circuit and a falling step response to a falling step signal input into the circuit; a step response analyzer that analyzes a result of the simulating of the rising step response and the falling step response; and a test pattern generator that generates, on the basis of a result of the analyzing, an upper-part test pattern that defines a shape of an upper part of an eye of the eye pattern and a lower-part test pattern that defines a shape of a lower part of the eye of the eye pattern, the simulator simulating the circuit using the upper-part test pattern and the lower-part test pattern.

As a third aspect of the embodiments, there is provided a method for generating an eye pattern of a circuit through a simulation using a prescribed test pattern in a computer, the method including: obtaining the number of longest continuous bits that continues a same value in the test pattern the longest; analyzing a result of a rising step response to a rising step signal input into the circuit and a result of a falling step response to a falling step signal input into the circuit; generating, on the basis of a result of the analyzing the rising step response and the number of longest continuous bits, an upper-part test pattern that defines a shape of an upper part of the eye of an eye pattern; and generating, on the basis of a result of the analyzing the falling step response and the number of longest continuous bits, a lower-part test pattern that defines an shape of a lower part of the eye of the eye pattern.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIG. 5 is a diagram schematically illustrating the inner shape of an eye pattern;

FIGS. 11A and 11B are diagrams denoting results of analysis by the step response analyze of FIG. 1, FIG. 11A being a table denoting an example of definition data of the circuit to be analyzed and FIG. 11B being a table denoting an example of the result of analysis on the circuit specified by the definition data of FIG. 11A;

FIG. 19 is a diagram illustrating a waveform for explaining a procedure of generating upper- and lower-part test patterns of an eye by the test pattern generator of FIG. 1;

FIGS. 26A through 26C are diagrams illustrating a manner of drawing an eye pattern, FIG. 26A being a diagram depicting an example of a transient waveform; FIG. 26B being a diagram depicting waveforms sampled in units of a frame from the transient waveform of FIG. 26B; and FIG. 26C being a diagram depicting an eye pattern obtained by overlaying the sampled waveforms with one another.

DESCRIPTION OF THE PREFERRED EMBODIMENTS

Hereinafter, an embodiment of the present invention is described with reference to the accompanying drawings.

1. Overview 1-1. Causes of Closing the Eye

The eye of an eye pattern closes for several causes. However, the first embodiment regards the following three phenomena (1) to (3) that can be simulated as causes of closing the eye.

(1) Transmission Loss

A transmission loss is a phenomenon that a signal output from a driver device is attenuated while the signal is being transmitted to a receiver device. Since the high-speed transmission has fast rising and falling speed, a transmitted signal has a high-frequency component. However, since wiring on a Printed Circuit Board (PCB) largely attenuates a high-frequency component, the signal waveform largely slacks to make the eye smaller.

(2) Reflection

If a device disposed between the driver device and the receiver device causes inconsistency of impedance, a signal being transmitted is divided into a transmitting signal and a reflecting signal at the device, so that the signal waveform largely deforms to make the eye smaller. High-speed signal transmission preferably minimizes such a reflection.

(3) Inter-Symbol Interference Depending on an Inputting Pattern

Inter-symbol interference will be detailed in the following item 1-2.

1-2. Inter-Symbol Interference

Inter-symbol interference is a phenomenon that the rising waveform and/or the falling waveform of a received waveform change with the pattern of an input signal. In high-speed transmission, a digital signal, which can be treated as a string of 0 bits and 1 bits, shifts to the ensuing bits before the individual bits come to be stable at 0 or 1 bit and behaves like an analog signal. Consequently, inter-symbol interference occurs.

Figure 2:
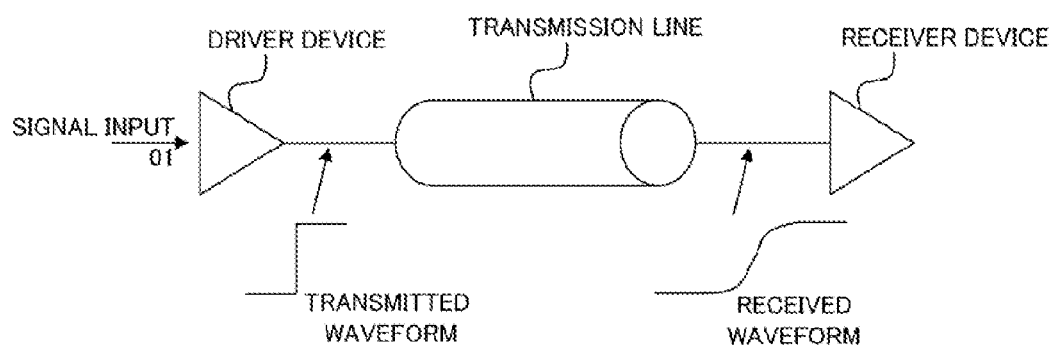
FIG. 2 is a diagram illustrating a circuit for explaining inter-symbol interference.
Figure 3A:
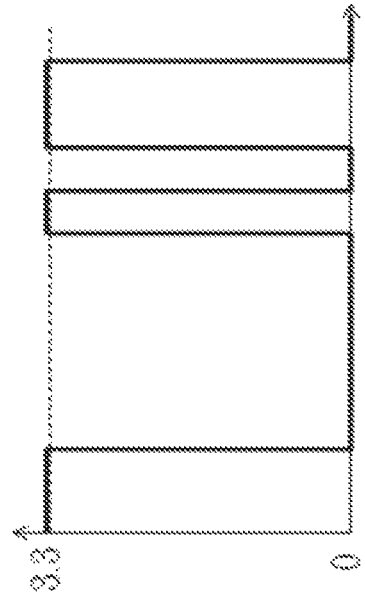
FIGS. 3A and 3B are diagrams illustrating examples of transmitted waveforms of the circuit of FIG. 2.
Figure 3B:
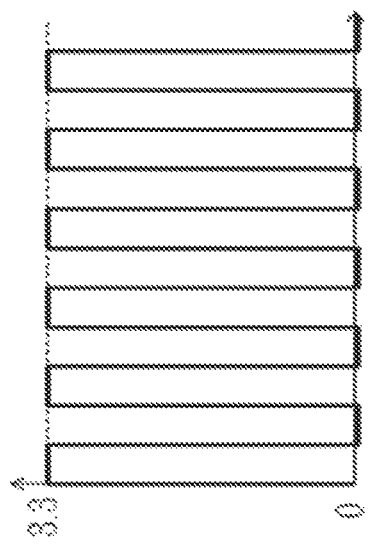
Figure 4B:
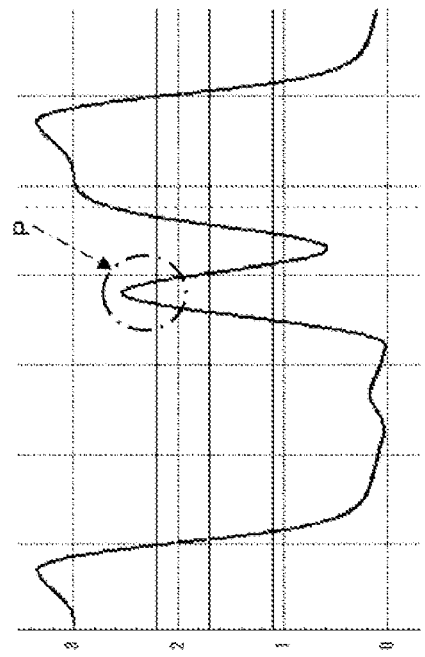
FIGS. 4A and 4B are diagrams illustrating examples of received waveforms obtained by transmitting the transmitted waveforms of FIGS. 3A and 3B through the circuit of FIG. 2.
Figure 4A:
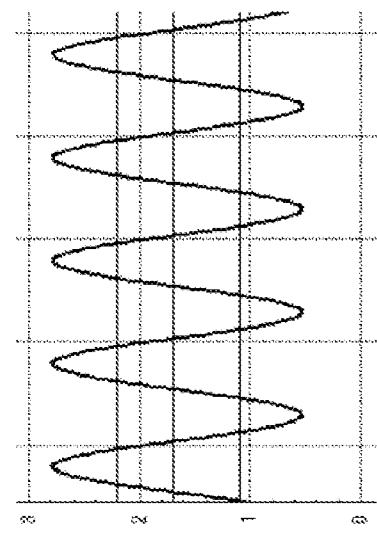

Inter-symbol interference will be further detailed with reference to FIGS. 2-4. FIG. 2 illustrates a circuit for explaining inter-symbol interference; FIGS. 3A and 3B illustrates examples of transmitted waveforms in the circuit of FIG. 2; and FIGS. 4A and 4B illustrate received waveforms of the transmitted waveforms of FIGS. 3A and 3B after transmitted through the circuit of FIG. 2. In FIGS. 3A, 3B, 4A, and 4B, the abscissas represent time and the ordinates represent a voltage.

The circuit of FIG. 2 includes a driver device, a transmission line, and a receiver device. Inputting a binary signal consisting of "0" and "1" into the driver device causes the device to output a transmitted waveform corresponding to the input binary signal. The transmitting waveform from the driver device is transmitted through the transmission line to the receiver device, which receives the waveform. As illustrated in FIG. 2, the driver device is inputted a binary signal "01" and responsively outputs a rising step signal (rising waveform). After the rising step signal (rising waveform) travels through the transmission line, the receiver device receives a rising waveform being rounded as depicted in FIG. 2.

For example, if a signal having a repeating pattern "10" is input into the driver device of the circuit of FIG. 2, the transmitted waveform input from the driver device to the transmission path takes the form of a rectangular wave periodically changes as depicted in FIG. 3A. When the rectangular wave of FIG. 3A travels through the transmission line, the received wave at the receiver device is a sine wave periodically changes as depicted in FIG. 4A.

If a binary signal having a pattern of "110000010110" is input in the driver device in the circuit of FIG. 2, the transmitted waveform input from the driver device to the transmission path takes the form of a rectangular wave having values 1 and 0 of the input signal as depicted in FIG. 3B. When the rectangular wave of FIG. 3B travels through the transmission line, the received wave at the receiver device largely changes in accordance with the input pattern as depicted in FIG. 4B. If a single bit varies to a value 1 (or 0) after continuous bits of the other same value 0 (or 1) and then the value returned to the other value 0 (or 1) in the input patterns illustrated in FIGS. 3B and 4B, inter-symbol interference becomes large.

In detail, continuous bits having the same value 0 or 1 changes the voltage level (Direct Current (DC) level) of the receiver end to the Low side or the High side. In the absence of reflection, changing the waveform at a short bit width under a state of the voltage level at the lowest at the Low end or the highest at the High end makes the wavelength impossible to reach the voltage level corresponding to the actual bit value as depicted in the portion P of FIG. 4B, so that the received waveform has a small margin to come into the severest state. Consequently, when an input pattern has, in sequence, continuous bits of the same value, a single bit changed to the other value, and one or more bits returned to the first value, the worst case of the inner shape (eye shape) of the eye pattern under the presence of intra-symbol interference occurs.

1-3. The Worst Case of the Inner Shape of an Eye Pattern Affected by Transmission Loss, Reflection, and Inter-Symbol Interference in Combination of One Another The worst case caused by inter-symbol interference is described as the above. The inner shape of an eye pattern in a real circuit is affected by transmission loss and multiple reflection due to impedance inconsistency as well as inter-symbol interference. For the above, the worst case of the inner shape of an eye pattern includes the multiple reflection in the state considering the inter-symbol interference and the transmission loss, and occurs when the bit value of the test pattern shortly varies (e.g. by only one bit) after the voltage level reaches the highest at the High end (or the lowest at the Low end). Since reflection occurs at number of points depending on the circuit configuration, affect of the reflection on the inner shape of the eye pattern needs simulation using a large number of test patterns, which takes a long time to analysis the refection.

1-4. Principle of Generating an Eye Pattern in a First Embodiment

The inner shape of the eye pattern of a waveform to be determined corresponds to the worst cases of the waveform to be determined. In the following explanation, the upper part of the inner shape of an eye pattern, that is, the upper-part waveform, is called "upper part of an eye" while the lower part of the shape of the eye, that is, the lower-part waveform, is called "lower part of an eye" as depicted in FIG. 5. FIG. 5 is a diagram schematically illustrating the inner shape (eye shape) of an eye pattern. In FIG. 5, the abscissa represents time and the ordinate represents a voltage.

This embodiment carries out step response analysis of an object circuit to check prospective influence of reflection including transmission loss beforehand, and generates the following upper-part test pattern and lower-part test pattern based on the result of the checking and prescribed test pattern for generating an eye pattern. An upper-part test pattern defines the shape of the upper part of an eye, and a lower-part test pattern defines the shape of the lower part of the eye. The upper-part and the lower-part test patterns consider the prospective influence of a transmission loss and the reflection, and has the shortest patterns that are capable of occurring the worst cases of the upper part and the lower part of an eye. A waveform output from a circuit when such generated upper-part and lower-part test patterns are each input into the circuit is simulated, and the upper-part and lower-part eye patterns are generated from the upper-part output waveform and the lower-part output waveform obtained through the simulation. Then, an eye pattern is generated by combining the generated upper- and lower-part eye patterns.

As the above, the first embodiment analyzes the step response and reads the waveforms of the result of the analysis, so that the timing of most superimposing multiple reflection including transmission loss can be grasped beforehand. On the basis of the checked timing, upper-part test pattern and lower-part test pattern are generated which can efficiently obtain the worst case of the inner shape of an eye pattern. In detail, upper-part and lower-part test patterns are generated which can rapidly generate the worst cases of the upper part and the lower part of an eye. A circuit simulation based on the test patterns generates upper-part and lower-part eye pattern, which will be combined. Thereby, an eye pattern having an inner shape of the worst case can be precisely and rapidly generated.

1-5. Basic Procedure of Generating an Eye Pattern in the First Embodiment

On the basis of the above description 1-1 through 1-4, the first embodiment basically generates an eye pattern along the following steps (11) to (17).

(11) The number of longest continuous bits (see D22 in FIGS. 7 and 10) of the same value continuing the longest in the test pattern of an input pulse is obtained. Then, the longest continuous bit time (see D31 in FIGS. 7, 10, 17, and 19) is calculated by multiplying the obtained number of longest continuous bits by the time for one bit. The time for one bit is set as a circuit operation condition.

Figure 7:
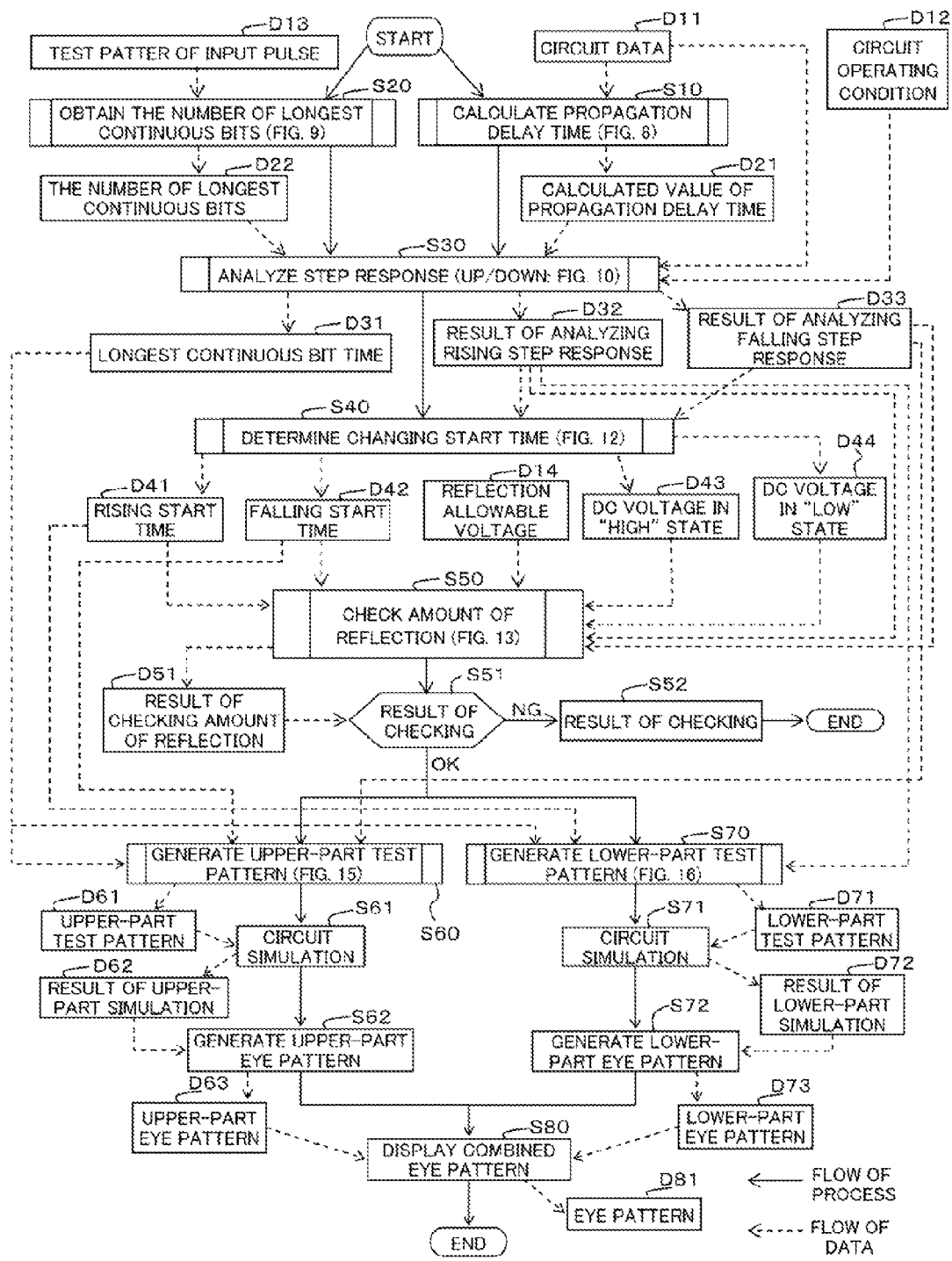
FIG. 7 is a flow diagram illustrating a succession of procedural steps of generating an eye pattern by the eye pattern generating device of FIG. 1.
Figure 10:
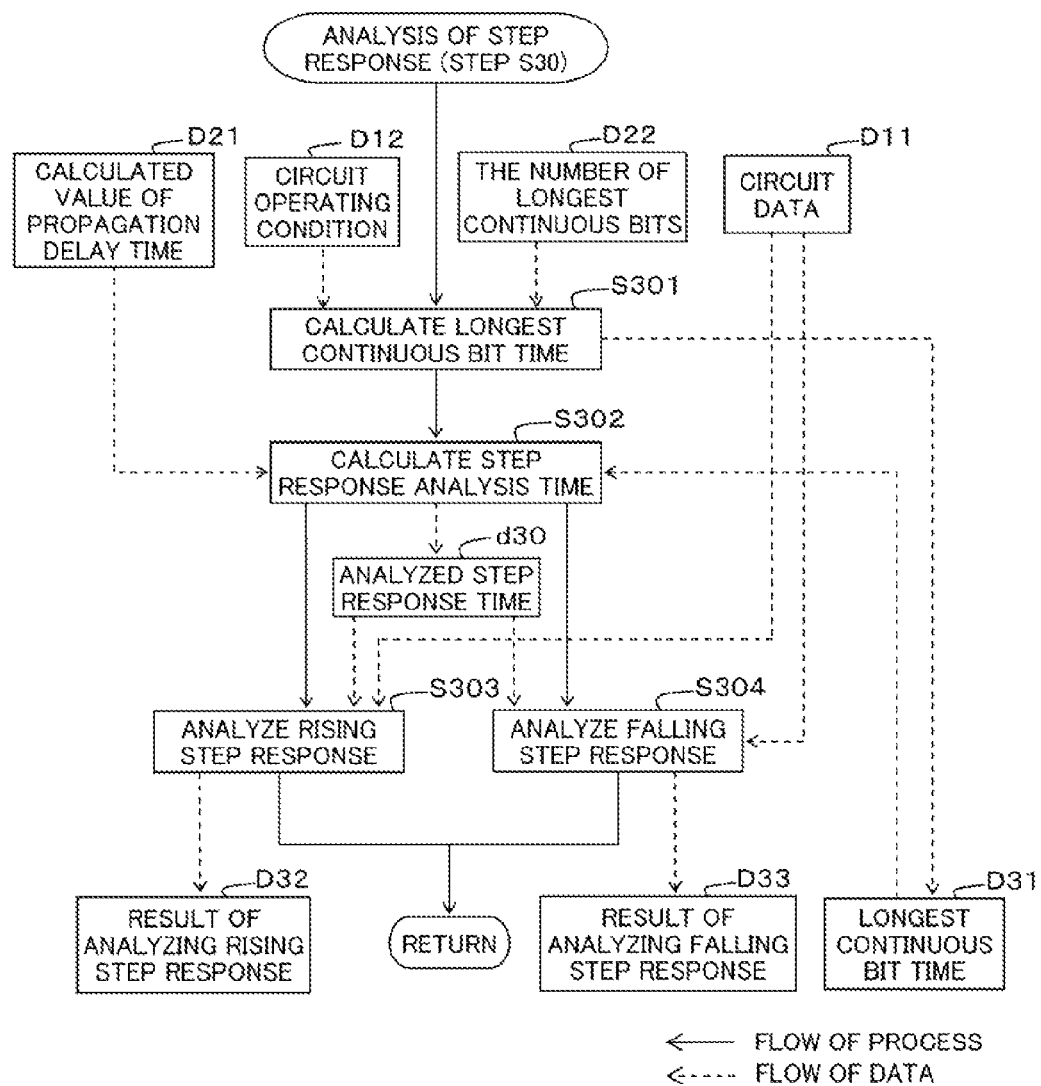
FIG. 10 is a flow diagram illustrating a succession of procedural steps of analysis by a step response analyzer of FIG. 1.

(12) A rising step response and a falling step response are analyzed (see step S30 in FIG. 7 and FIG. 10).

Figure 13:
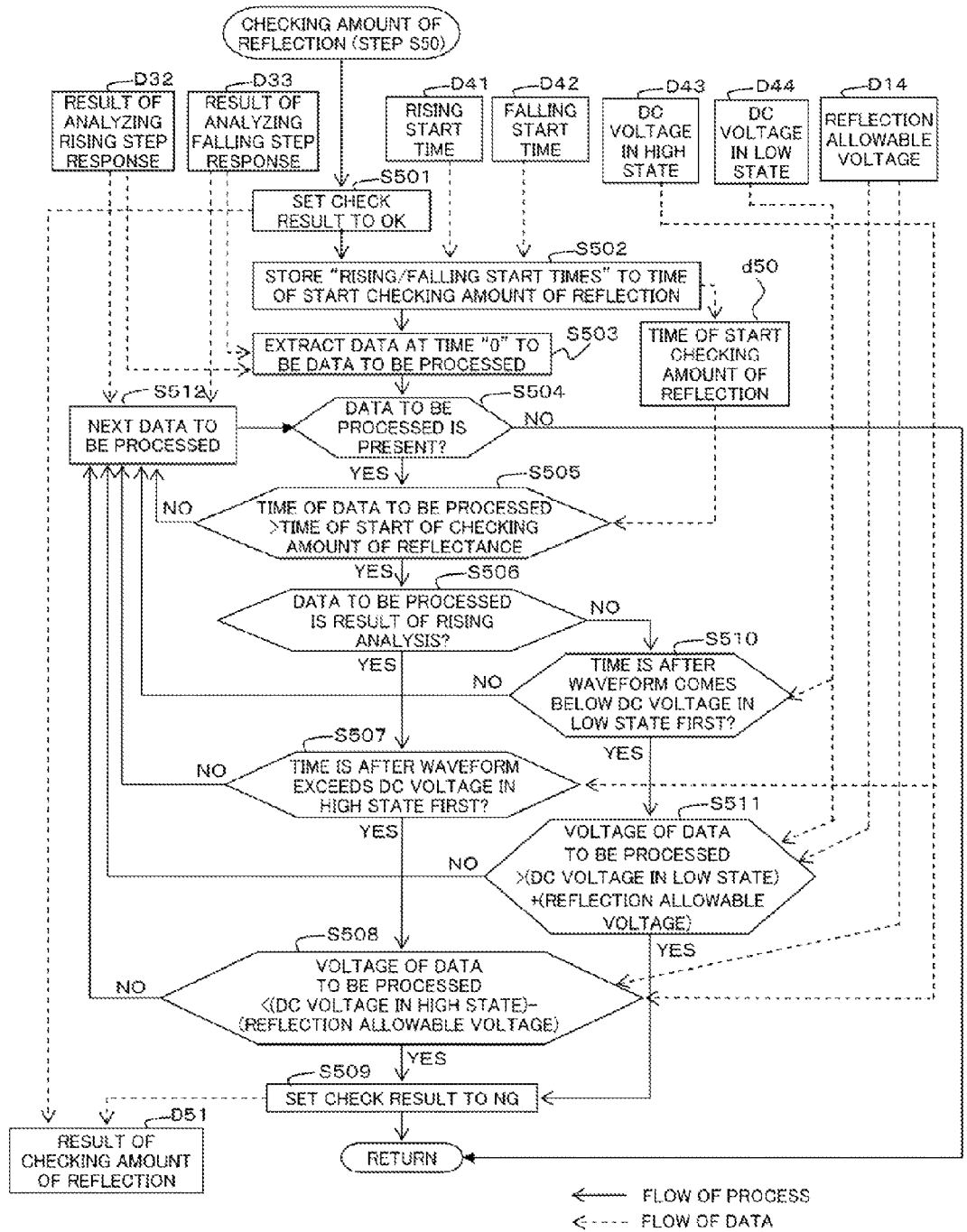
FIG. 13 is a flow diagram illustrating a succession of procedural steps of checking an amount of reflection by a checker of FIG. 1.
Figure 14:
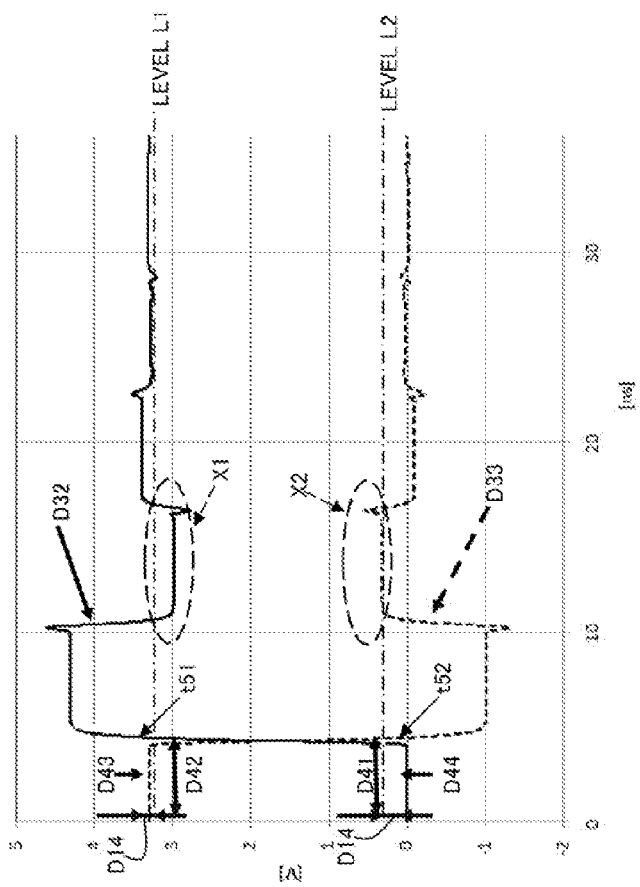
FIG. 14 is a waveform diagram illustrating a succession of procedural steps of checking an amount of reflection by the checker of FIG. 1.

(13) On the basis of the result of the step response analysis, the presence of large reflection is checked (see step S50 in FIG. 7, and FIGS. 13 and 14). If the reflection is large, the object circuit is incapable of handling a high-speed transmission and needs a change in design to suppress the reflection, which is notified to a user by means of error displaying (see step S52 in FIG. 7). Large reflection is a problem related to a premise before eye pattern analysis. Not carrying out eye pattern analysis makes it possible to omit needless analysis.

Figure 15:
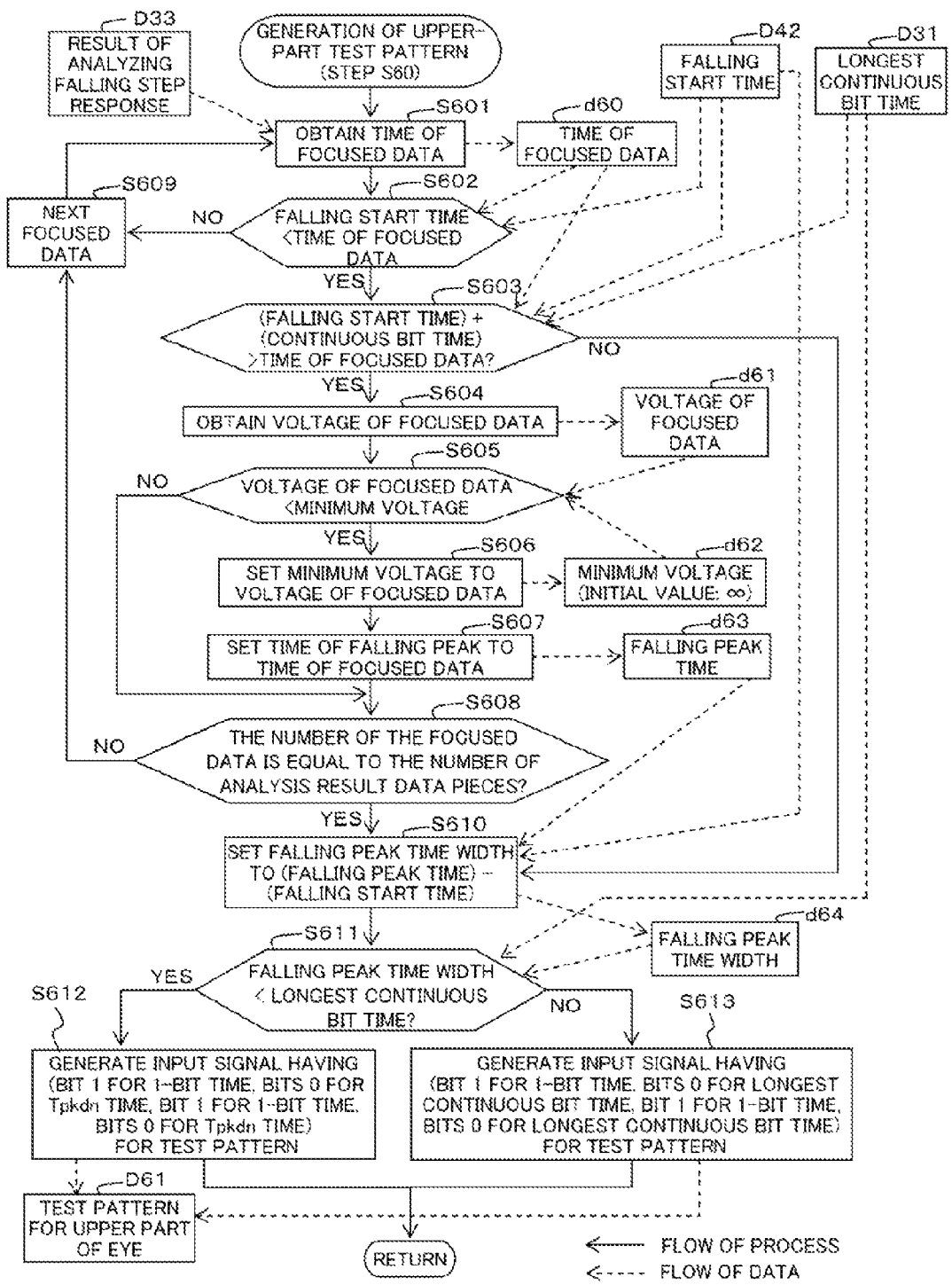
FIG. 15 is a flow diagram illustrating a succession of procedural steps of generating an upper-part test pattern of an eye by a test pattern generator of FIG. 1.
Figure 16:
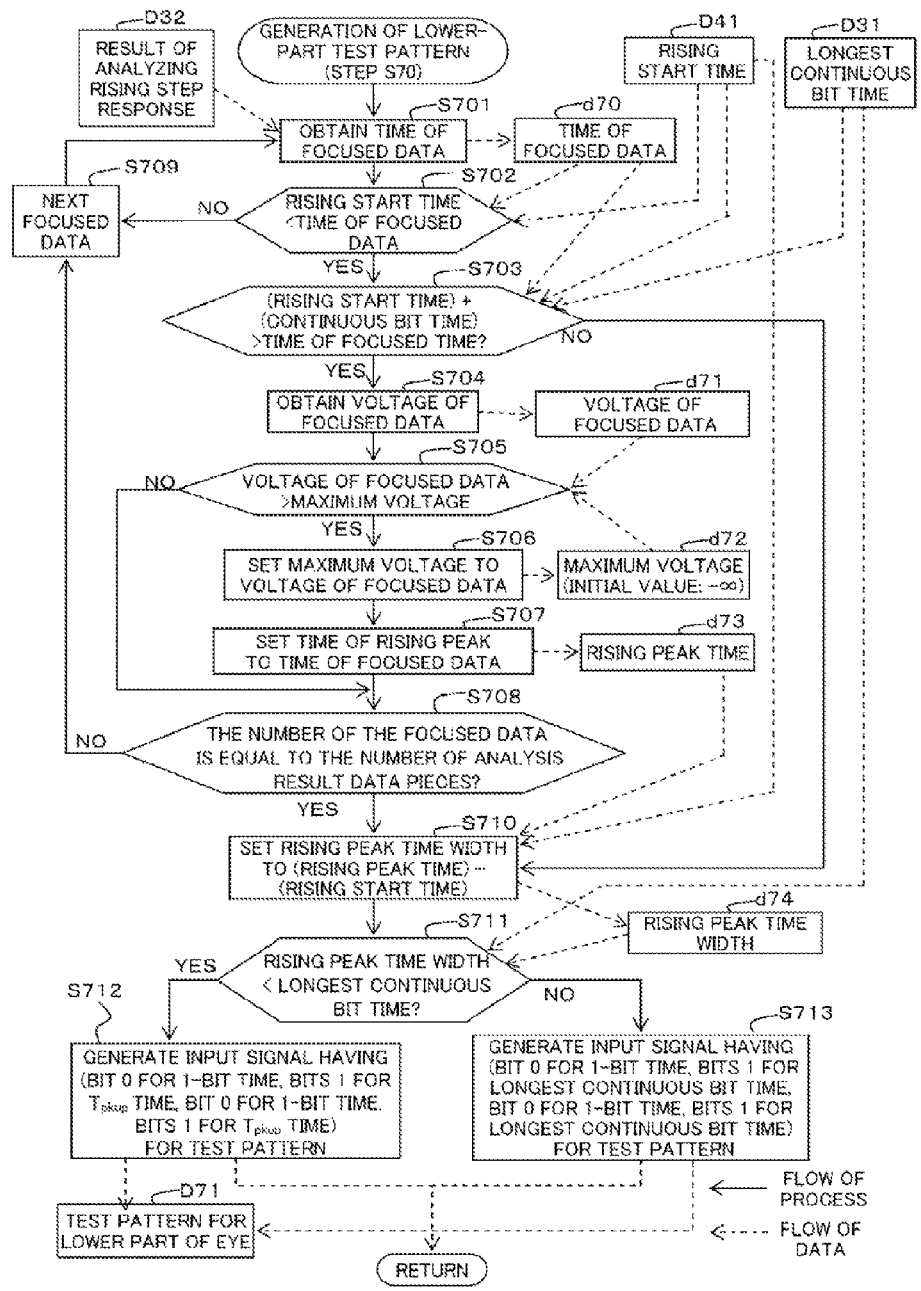
FIG. 16 is a flow diagram illustrating a succession of procedural steps of generating a lower-part test pattern of an eye by the test pattern generator of FIG. 1.

(14) On the basis of the result of analyzing a falling step response, a falling peak time width is calculated which is the time from the start of changing the wavelength of a falling step response until the voltage come to be a peak within the longest continuous bit time, and in the same manner, on the basis of the result of analyzing a rising step response, a rising peak time width is calculated which is the time from the start of changing the wavelength of a rising step response until the voltage come to be a peak within the longest continuous bit time (see step S610 and d64 in FIG. 15, and step S710 and d74 in FIG. 16).

(15) On the basis of the largeness relationship between the falling peak time width and the longest continuous bit time, the upper-part test pattern is generated as follows.

Figure 18A:
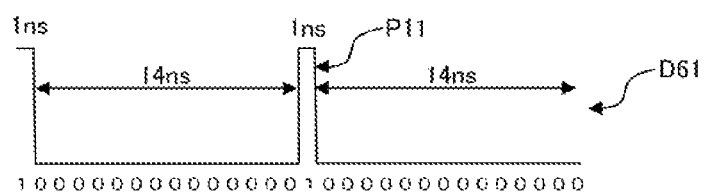
FIGS. 18A and 18B are diagrams illustrating an upper-part test pattern and a lower-part test pattern generated under a state corresponding to the waveform diagram of FIG. 17, respectively.

If the falling peak time width is smaller than the longest continuous bit time, the upper-part test pattern is generated using the falling peak time width (see step S612 of FIG. 15, and FIG. 18A).

Figure 20A:
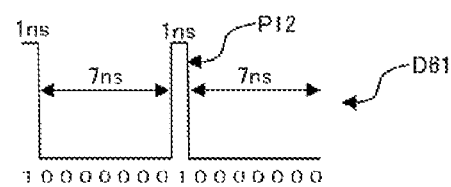
FIGS. 20A and 20B are diagrams illustrating an upper-part test pattern and a lower-part test pattern generated under a state corresponding to the waveform diagram of FIG. 19, respectively.

In contrast, if the falling peak time width is equal to or larger than the longest continuous bit time, the upper-part test pattern is generated using the longest continuous bit time (see step S613 of FIG. 15, and FIG. 20A).

In the same manner, on the basis of the largeness relationship between the rising peak time width and the longest continuous bit time, the lower-part test pattern is generated as follows.

Figure 18B:
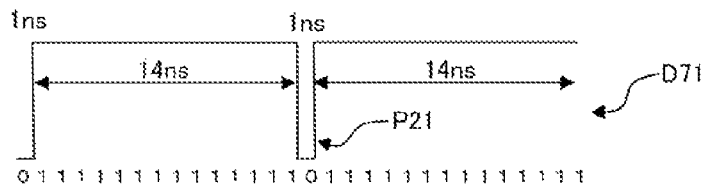

If the rising peak time width is smaller than the longest continuous bit time, the lower-part test pattern is generated using the rising peak time width (see step S712 of FIG. 16, and FIG. 18B).

Figure 20B:
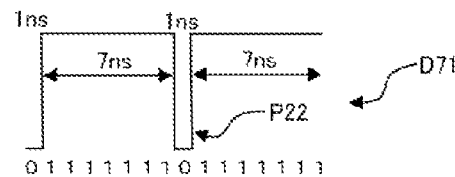

In contrast, if the rising peak time width is equal to or larger than the longest continuous bit time, the lowest-part test pattern is generated using the longest continuous bit time (see step S713 of FIG. 16, and FIG. 20B).

(16) Response waveforms (output waveform from the object circuit) of the upper-part test pattern and the lower-part test pattern are obtained through circuit simulation, and an upper-part eye pattern and a lower-part eye pattern are generated from the upper-part output waveform and the lower-part output waveform obtained as the above, respectively (see steps S61, S62, S71, and S72 of FIG. 7).

Figure 22A:
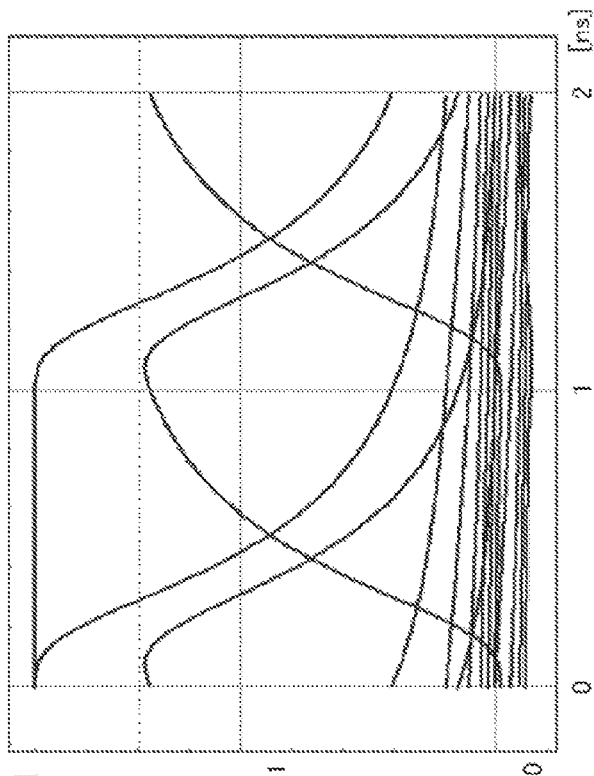
FIGS. 22A and 22B are diagrams depicting an upper-part eye pattern and a lower-part eye pattern generated from the output waveforms (response waveforms) of FIGS. 21A and 21B.
Figure 22B:
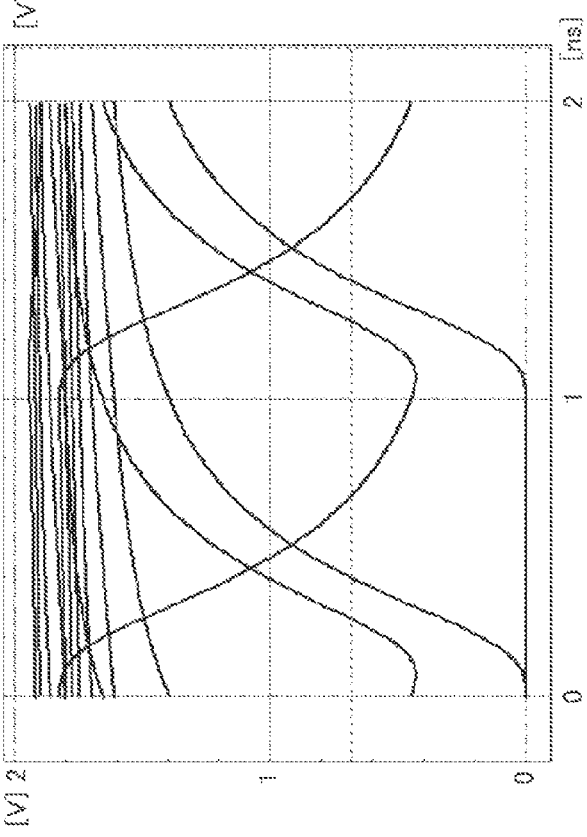
Figure 23:
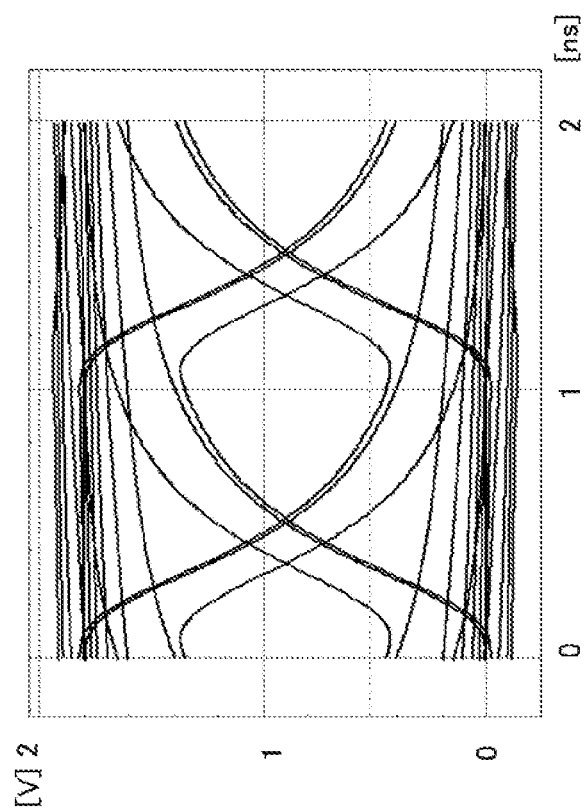
FIG. 23 is a diagram depicting an eye pattern generated by combining the upper-part eye pattern and the lower-part eye pattern of FIGS. 22A and 22B, respectively.

(17) The upper-part eye pattern (see FIG. 22A) and the lower-part eye pattern (see FIG. 22B) are combined to generate an eye pattern (see FIG. 23).

2. Configuration of the Eye Pattern Generating Device of the First Embodiment Hereinafter, the eye pattern generating device of the first embodiment will now be detailed along the above description of 1-1 through 1-5 with reference to FIGS. 1-25.

Figure 1:
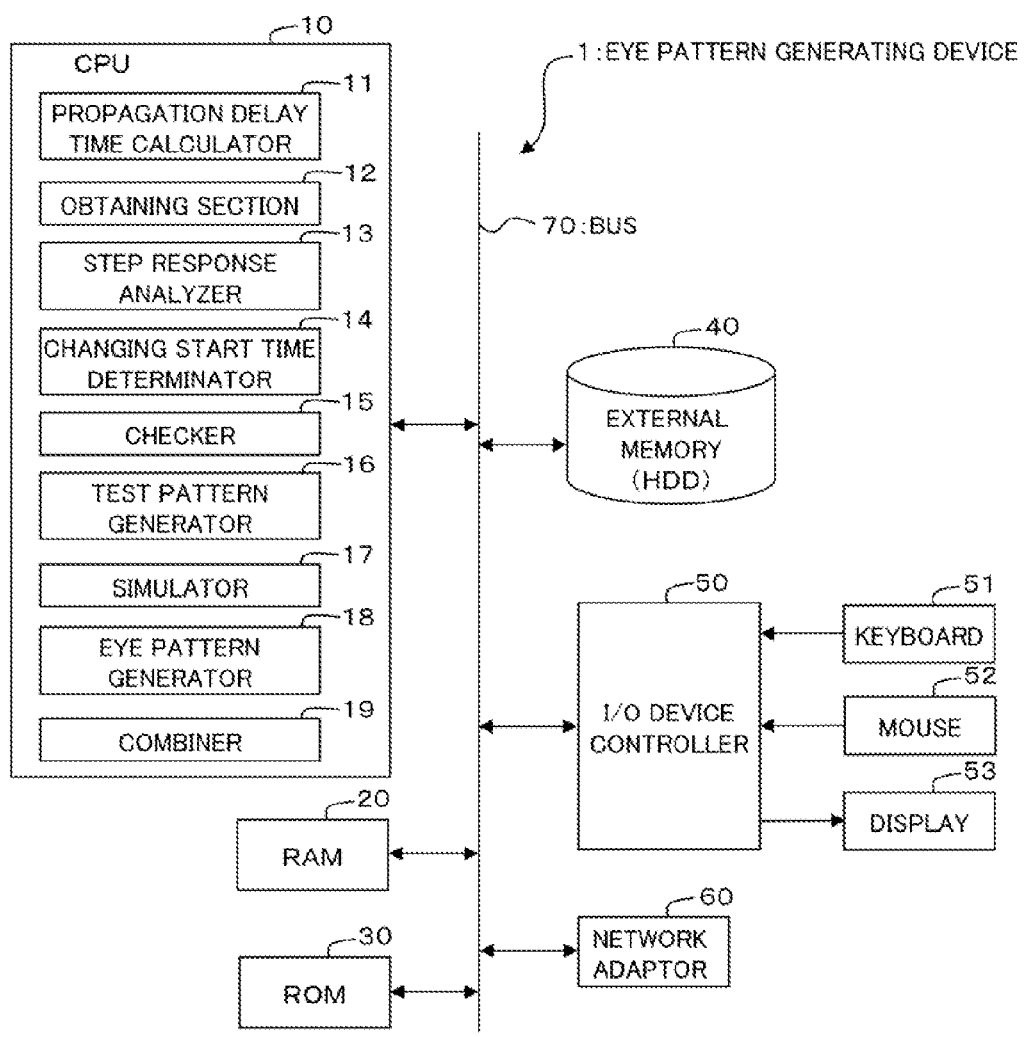
FIG. 1 is a block diagram illustrating a hardware configuration and a functional configuration of an eye pattern generating device according to the first embodiment.

FIG. 1 is a block diagram schematically illustrating the hardware and functional configurations of an eye pattern generating device 1 of the first embodiment. The eye pattern generating device 1 of the first embodiment serves to function as part of a circuit simulator.

The eye pattern generating device 1 of FIG. 1 is exemplified by a computer such as a normal PC, and generates an eye pattern of an object circuit through simulation, using a test pattern (to be detailed below) defined by the standard of high-speed serial transmission.

The eye pattern generating device 1 includes a CPU (Central Processing Unit) 10, a RAM (Random Access Memory) 20, a ROM (Read Only Memory) 30, an external memory 40, an input/output (I/O) device controller 50, a keyboard 51, a mouse 52, a display 53, a network adaptor 60, and bus 70.

Here, the I/O device controller 50 controls the keyboard 51, the mouse 52, and the display 53, which function as man-machine interface. The keyboard 51 and the mouse 52 are operated by a designer to input various information pieces into the device 1 while the display 53 displays various information pieces, such as results of processing by the CPU 10.

The network adaptor 60 is the interface between an external network (not illustrated) and the device 1. The bus 70 communicably connects the CPU 10, the RAM 20, the ROM 30, the external memory 40, the I/O device controller 50, and the network adaptor 60 to one another.

The CPU (processor) 10 executes a circuit simulator program (eye pattern generating program) and thereby functions as a propagation delay time calculator 11, an obtaining section 12, a step response analyzer 13, a changing start time determinator 14, a checker 15, a test pattern generator 16, a simulator 17, an eye pattern generator 18, and a combiner 19 which will be detailed below.

The RAM 20, the ROM 30, and the external memory 40 serve as the memory of the device 1 and store various information pieces related to generation of an eye pattern.

Examples of the external memory 40 are a Hard Disk Drive (HDD) or a Solid State Drive (SSD).

The above memory previously stores various information pieces to be used by the CPU 10 for generating an eye pattern. Examples of the information are the circuit simulator program (eye pattern generating program), circuit data D11, circuit operating condition D12, a test pattern D13 of an input pulse, and a reflection allowable voltage D14 that are to be detailed below. The memory also stores various information pieces generated in the course of generation of an eye pattern, such as information pieces having reference numbers of D21, D22, D31-D33, D41-D44, D51, D52, D61-D63, D71-D73, D81, d10, d20-d23, d30, d40-42, d50, d60-d64, and d70-d74 in the following description.

The circuit data D11 previously stored in the memory includes models of passive devices constituting the circuit (object circuit) for which an eye pattern is to be generated, and information related to transmission lines constituting the circuit (i.e., wiring data of the printed circuit board (PCB)). Examples of the passive devices are a driver device, a receiver device, and a resistor.

Figure 6:
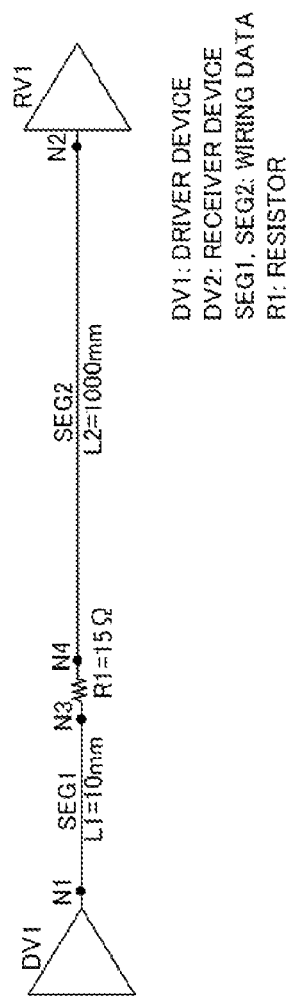
FIG. 6 is a circuit diagram illustrating an example of a configuration of an object circuit for explaining the circuit data.

Here, FIG. 6 is a circuit diagram depicting an example of a detailed configuration of the object circuit for explaining the circuit data D11. In FIG. 6, DV1 represents a driver device that drives a signal and outputs the signal to the transmission line; RV1 is a receiver device that receives a signal from the transmission line; R1 is a resistor (having a resistance of 15Ω) disposed on the transmission line between the driver device DV1 and the receiver device RV1; SEG1 is wiring data (e.g. the wiring length L1=10 mm) between the driver device DV1 and the resistor R1 on the PCB; SEG2 is wiring data (e.g. the wiring length L2=1000 mm) between the resistor R1 and the receiver device RV1 on the PCB; N1 is a connection node between the output end of the deriver device DV1 and the input end of the wiring SEG1; N3 is a connection node between the output end of the wiring SEG1 and the input end of the resistor R1; N4 is a connection node between the output end of the resistor R1 and the input end of the wiring SEG2; and N2 is a connection node between the output end of the wiring SEG2 and the input end of the receiver device RV1.

The circuit data D11 includes model of the driver device DV1 and that of the receiver device RV1. Examples of such model are a Simulation Program with Integrated Circuit Emphasis (SPICE) model or an I/O Buffer Information Specification (IBIS) model. The wiring data SEG1 and SEG2 in the circuit data D11 include data related to the cross sectional structure of the board (e.g., the power source, the GND layer thickness, the insulator layer thickness, the resist thickness, a specific inductive capacity, a dielectric loss tangent, the position of the conductor, the direction of pattern printing, the shape of cross section of the conductor, and the conductivity), the wiring lengths, and the wiring widths.

The circuit operating condition D12 previously stored in the memory defines the condition (e.g., which device serves as a driver, which device serves as a receiver, the operation frequency of the driver, an observation point of a waveform) for operation of the object circuit. For example, the circuit operating condition D12 of the circuit depicted in FIG. 6 defines that the driver device is DV1; the frequency of a signal driven by the driver device DV1 is 500 MHz (on the basis of the bit width, a one-bit width being 1 ns); the receiver device is RV1; the observation point node (node at which the eye pattern is observed) is N2.

The test pattern D13 of an input pulse previously stored in the memory is a bit string of "0" and "1" representing a signal to be input into the driver device DV1 of the object circuit. The high-speed serial transmission prescribes the test patterns according to the standard. In order to achieve the standard, the eye obtained by the test using the test pattern has an opening more than a predetermined value. The following is an example of a 512-bit test pattern (hereinafter called "USB test pattern") determined for the USB:
0101010101010101010101010101010000101000101 0101
0101010101010101010101010101010101010101010
1010101010101010101100110011001100110011001 1001
1001100110011001100110011001100110011110000 1111
0000111100001111000011110000111100001111000 0111
1000011111100000000111111100000000111111100 00000
1111111000000011111111000000001111111000000 11111
1100000001111111000000001111111101111111011 11110
1111111011111110111111101111111011111111101 000000
0100000001000000010000000100000001000000010 00000
0010000000 100000001000000010111000110000 10.

Next, description will now be made in relation to the functions of the CPU 10, which specifically are: the propagation delay time calculator 11, the obtaining section 12, the step response analyzer 13, the changing start time determinator 14, the checker 15, the test pattern generator 16, the simulator 17, the eye pattern generator 18, and the combiner 19.

The propagation delay time calculator 11 calculates a value D21 of propagation delay time (see FIGS. 7 and 8) using the circuit data D11, and stores the calculated value D21 into the memory. A propagation delay time is a time period from output of a waveform from the output end N1 of the driver device DV1 to arrival of the output waveform at the input end, that is, the observation point N2. Specifically, the propagation delay time calculator 11 calculates delay times that the signal takes to pass through each device disposed from the output end N1 of the driver device DV1 to the observation point N2, and totals the calculated delay times of all the devices. The total of the delay times are regarded as the calculated value D21 of the propagation delay time. Since a real propagation delay time is affected by a capacity component inside the receiver device RV1, the calculated value D21 of the propagation delay time calculated by the propagation delay time calculator 11 includes a minute error.

The obtaining section 12 obtains the number D22 (see FIGS. 7 and 9) of longest continuous bits that continues the same value in the test pattern D13, and stores the obtained number D22 into the memory. In detail, the obtaining section 12 obtains the maximum number of continuous bits of the same value 0 or 1 from the test pattern D13, and regards the obtained maximum number to be the number D22 of longest continuous bits. Since the test pattern D13 is set to have a bit string in the forward order symmetric with that of the reverse order, the maximum number of longest continuous bits of "0" is the same as that of "1". Accordingly, the obtaining section 12 satisfactorily obtains the number of longest continuous bits for either bit "0" or "1". If the number of longest continuous bits of the bit "0" is different from that of the bit "1", the obtaining section 12 obtains the number of longest continuous bits of the bit "0" and that of "1".

The step response analyzer 13 analyzes a rising step response to a rising step signal (rising waveform) input into the object circuit, and also analyses a falling step response to a falling step signal (falling waveform) input into the object circuit. For this purpose, the step response analyzer 13 continues the analysis of a rising step response and a falling step response for a predetermined step response analysis time. The results D32 and D33 (see FIGS. 7 and 10) of the analysis by the step response analyzer 13 are output in the form of the tables as depicted in FIGS. 11A and 11B, for example, which are stored into the memory. The predetermined step response analysis time is a time to obtain the least data for generating an eye pattern, that is, the shortest time for the analysis, and is calculated below.

[step response analysis time](see d30 in FIG. 10)=
[input delay time of an input pulse (i.e., a rising or falling step signal)]+[longest continuous bit time]+[propagation delay time]×[margin coefficient (predetermined factor)]

Here, the input delay time of the input pulse is a time period from the start to the completion of a change (change from 0 to 1 or from 1 to 0) of a waveform (rising or falling waveform) input for a step response analysis, and is set and stored in the memory in advance.

The longest continuous bit time is the time D31 (see FIGS. 7 and 10) obtained by multiplying the number D22 of longest continuous bits obtained by the obtaining section 12 by a time for one bit calculated from the operation frequency defined in the circuit operating condition D12 of the object circuit.

The propagation delay time is a calculated value D21 of a time for which a waveform from the input end N1 of the object circuit arrives at the observation point N2, the value D21 being calculated by the propagation delay time calculator 11.

The margin coefficient (predetermined factor) allows an error in calculating the calculated value D21 of the propagation delay time and is peculiar to the system. A value which is one or more and which is close to one is selected as the margin coefficient.

A rising step response waveform and a falling step response waveform respectively to inputting of the rising step signal and the falling step signal are obtained through simulation that the simulator 17 carries out before the analysis by the step response analyzer 13.

Figure 12:
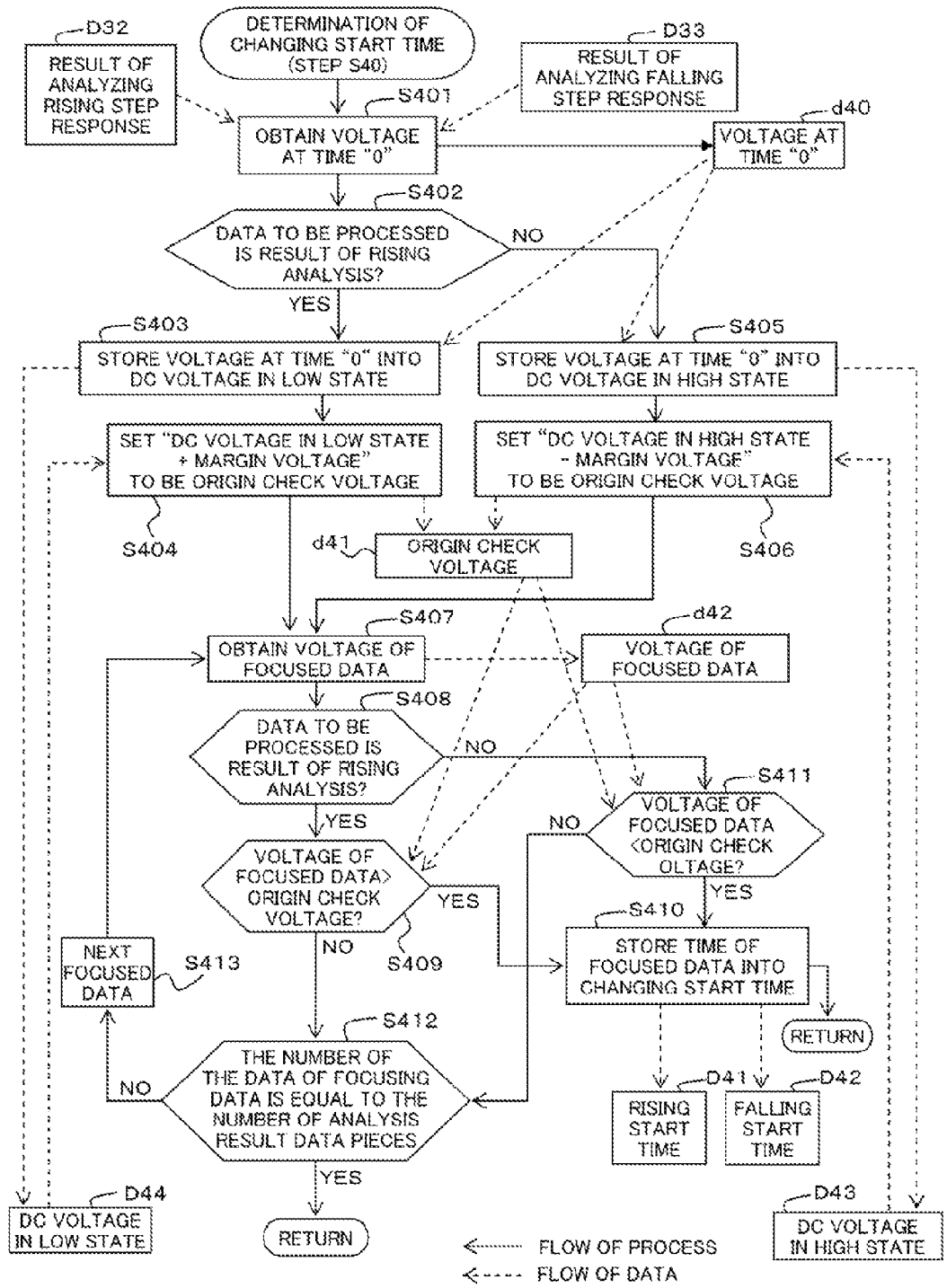
FIG. 12 is a flow diagram illustrating a succession of procedural steps of determination by a changing start time determinator of FIG. 1.

The changing start time determinator 14 obtains a rising start time D41 of the rising step response waveform; a falling start time D42 of the falling step response waveform; a DC voltage D43 in the High state of the falling step response waveform; and a DC voltage D44 in the Low state of the rising step response waveform, on the basis of the result D32 of analyzing the rising step response and the results D33 of analyzing the falling step response obtained by the step response analyzer 13, and stores the obtained data pieces into the memory (see FIGS. 7 and 12).

The DC voltage D44 in the Low state of the rising step response waveform is obtained from a waveform previous to rising the waveform in the Low state into the High state by the driver device DV1, on the basis of the result D32 of analyzing the rising step response, and a voltage value of the rising step response waveform at time 0 is actually obtained as the DC voltage D44.

The DC voltage D43 in the High state of the falling step response waveform is obtained from a waveform previous to falling the waveform in the High state into the Low state by the driver device DV1, on the basis of the result D33 of analyzing the falling step response, and a voltage value of the falling step response waveform at time 0 is actually obtained as the DC voltage D43.

A rising start time D41 of the rising step response waveform is a time that the rising step response waveform starts rising at the observation point N2, the time being obtained on the basis of the result D32 of analyzing the rising step response.

A falling start time D42 of the falling step response waveform is a time that the falling step response waveform starts falling at the observation point N2, the time being obtained on the basis of the result D33 of analyzing the falling step response.

The checker 15 checks an amount of multiple reflection of the object circuit on the basis of the result D32 of analyzing the rising step response and the result D33 of analyzing the falling step response by the step response analyzer 13, the changing start times D41 and D42, the DC voltages D43 and D44, and a reflection allowable voltage D14, and stores the result D51 (see FIGS. 7 and 13) of checking an amount of reflection into the memory. If determining that the amount of reflection exceeds the allowable value, the checker 15 notifies the user of the excess, and terminates the process related to the object circuit. On the other hand, if determining that the amount of reflection is the allowable value or less, the checker 15 instructs the test pattern generator 16 to carry out the process.

The test pattern generator 16 generates an upper-part test pattern D61 that defines the upper-part shape of the inside of the eye of the eye pattern on the basis of the longest continuous bit time D31 (the number D22 of longest continuous bits), the result D33 of analyzing the falling step response, and the falling start time D42, and stores the generated upper-part test pattern D61 into the memory. In the same manner, the test pattern generator 16 generates a lower-part test pattern D71 that defines the lower-part shape of the inside of the eye of the eye pattern on the basis of the longest continuous bit time D31 (the number D22 of longest continuous bits), the result D32 of analyzing the rising step response, and rising start time D41, and stores the generated lower-part test pattern D71 into the memory.

The detailed procedure of generating the upper-part test pattern D61 by the test pattern generator 16 will be described below with reference to FIGS. 15 and 17-20, and includes the following basic steps (21) through (24):

(21) calculating a falling peak time width d64 (see FIG. 15) from the falling start time D42 of the falling step response to the arrival of the falling step response at the minimum within the longest continuous bit time D31;

(22) comparing the falling peak time width d64 and the longest continuous bit time D31 (i.e., the time of the product of the number D22 of longest continuous bits and the time for one bit);

(23) if the falling peak time width d64 is smaller than the longest continuous bit time D31, generating a pattern repeating a pattern unit having bit "1" for one bit followed by the number of continuous "0" bits according to the falling peak time width d64 twice as the upper-part test pattern D61 (see FIGS. 15 and 18A); and

(24) if the falling peak time width d64 is equal to or larger than the longest continuous bit time D31, generating a pattern repeating a pattern unit having bit "1" for one bit followed by the number of continuous "0" bits according to the longest continuous bit time D31 twice as the upper-part test pattern D61 (see FIGS. 15 and 20A).

The detailed procedure of generating the lower-part test pattern D71 by the test pattern generator 16 will be described below with reference to FIGS. 16-20, and includes the following basic steps (31) through (34):

(31) calculating a rising peak time width d74 (see FIG. 16) from the rising start time D41 of the rising step response to the arrival of the rising step response at the maximum within the longest continuous bit time D31;

(32) comparing the rising peak time width d74 and the longest continuous bit time D31;

(33) if the rising peak time width d74 is smaller than the longest continuous bit time D31, generating a pattern repeating a pattern unit having bit "0" for one bit followed by the number of continuous "1" bits according to the rising peak time width d74 twice as the lower-part test pattern D71 (see FIGS. 16 and 18B); and

(34) if the rising peak time width d74 is equal to or larger than the longest continuous bit time D31, generating a pattern repeating a pattern unit having bit "0" for one bit followed by the number of continuous "1" bits according to the longest continuous bit time D31 twice as the lower-part test pattern D71 (see FIGS. 16 and 20B).

The simulator 17 simulates output waveforms (response waveform observed at the observation point N2) from the object circuit when the upper-part test pattern D61 and the lower-part test pattern D71 are input into the object circuit. The obtained result D62 of upper-part simulation (see FIGS. 7 and 21A) and the obtained result D72 of lower-part simulation (see FIGS. 7 and 21B) are stored into the memory. The analysis time that the simulator 17 takes is time for obtaining least data to generate an eye pattern, that is, the shortest analysis time, and is calculated as follows.

[simulation analysis time]=[test pattern time]+[propagation delay time]×[margin coefficient(predetermined factor)]

Here, the propagation delay time and the margin coefficient (predetermined factor) are same as those used for calculating a step response analysis time, and the explanation thereof is omitted here. The test pattern time is time obtained by multiplying the number of bits of the test pattern D61 or D71 generated by the test pattern generator 16 by the time for one bit calculated from the operation frequency defined in the circuit operating condition D12 of the object circuit.

The eye pattern generator 18 generates an upper-part eye pattern D63 (see FIGS. 7 and 22A) and a lower-part eye pattern D73 (see FIGS. 7 and 22B) respectively from the output waveforms D62 and D72 obtained by simulation on the upper-part test pattern D61 and the lower-part test pattern D71. The generated upper-part eye pattern D63 and lower-part eye pattern D73 are stored into the memory The combiner 19 combines the upper-part eye pattern D63 and the lower-part eye pattern D73 to thereby generate an eye pattern D81 (see FIGS. 7, 23, and 24) of the object circuit, and stores the generated eye pattern D81 into the memory.

3. Operation of the Eye Pattern Generating Device of the First Embodiment

Next, description will now be made in relation to the specific operation of the eye pattern generating device 1 of the first embodiment, which has the above configuration, with reference to FIGS. 7-25.

3.1. Procedure of Generating an Eye Pattern

To begin with, a procedure of generating an eye pattern by the eye pattern generating device 1 of FIG. 1 will be now described along the flow diagram (steps S10-S80) of FIG. 7. Solid arrows represent flow of process and broken arrows represent flow of data in the flow diagrams.

The propagation delay time calculator 11 calculates a calculated value D21 of the propagation delay time based on the circuit data D11, and stores the calculated value D21 into the memory (step S10). The detailed procedure of calculating the calculated value D21 of the propagation delay time in step S10 will be described with reference to FIG. 8.

The obtaining section 12 obtains the number D22 of longest continuous bits that continues the same value the longest in the test pattern D13, and stores the number D22 into the memory (step S20). The detailed procedure of obtaining the number D22 of longest continuous bits in step S20 will be detailed below with reference to FIG. 9.

The step response analyzer 13 analyzes a rising step response and a falling step response for a step response analysis time (d30 in FIG. 10) (step S30). The step response analysis time d30 is calculated using the expression described above by the step response analyzer 13. Along with the calculation of the step response analysis time d30, the longest continuous bit time D31 is calculated by multiplying the number D22 of longest continuous bits by a time for one bit calculated from the operation frequency defined in the circuit operating condition D12, and is then stored into the memory. The result D32 of analyzing the rising step response and the result D33 of analyzing the falling step response obtained by the step response analyzer 13 are also stored in the memory. The procedure and the results of the analysis in step S30 will be detailed below with reference to FIGS. 10, 11A, and 11B.

Upon obtaining the results of analyzing step responses, the changing start time determinator 14 reads the result D32 of analyzing the rising step response and the result D33 of analyzing the falling step response from the memory. Then, the changing start time determinator 14 calculates, on the basis of the read results D32 and D33 of analyzing, the rising start time D41, the falling start time D42, a DC voltage D43 in High state, and a DC voltage D44 in Low state, which are then stored into the memory (step S40). The procedure of the determination in step S40 will be detailed below with reference to FIG. 12.

After that, the checker 15 checks an amount of multiple reflection of the object circuit on the basis of the results D32 and D33 of analyzing step responses, the changing start times D41 and D42, the DC voltages D43 and D44, and the reflection allowable voltage D14. The result D51 (OK or NG) of the check is then stored into the memory (step S50). If the checker 15 determines the amount of reflection to exceeds the allowable value, that is, if the result D51 of the check is NG (not good) (NG route in step S51), the user is notified of "unavailability of high-speed transmission" on the display 53 (step S52), and the process for the object circuit is terminated. Conversely, if the checker 15 determines the amount of reflection to be equal to or lower than the allowable value, that is the result D51 of the check is OK (OK route in step S51), the next processes (steps S60 and S70) are to be carried out. The procedure of checking an amount of reflection in step S50 will be detailed below with reference to FIGS. 13 and 14.

If the result D51 of the check is OK, the test pattern generator 16 generates upper-part test pattern D61 that defines the upper-part shape of the inside of the eye of the eye pattern on the basis of the longest continuous bit time D31, the result D33 of analyzing the falling step response, and falling start time D42, and stores the D61 into the memory (step S60). The procedure of generating the upper-part test pattern D61 in step S60 will be detailed below with reference to FIGS. 15, and 17-20.

If the result D51 of the check is OK, the test pattern generator 16 also generates the lower-part test pattern D71 that defines the lower-part shape of the inside of the eye of the eye pattern on the basis of the longest continuous bit time D31, the result D32 of analyzing the rising step response, and the rising start time D41, and stores the lower-part test pattern D71 into the memory (step S70). The procedure of generating the lower-part test pattern D71 in the step S70 will be detailed below with reference to FIGS. 16-20.

Upon the generation of the upper-part test pattern D61 and the lower-part test pattern D71, the simulator 17 simulates output waveforms (i.e., response waveforms observed at the observation point N2) from the object circuit when the upper-part test pattern D61 and lower-part test pattern D71 are input into the object circuit. The result D62 of the upper-part simulation (output waveform) and the result D72 of the lower-part simulation (output waveform) obtained through the simulation are stored in the memory (steps S61 and S71). The operation of the simulator 17 will be detailed below with reference to FIGS. 21A and 21B.

Upon obtaining the output waveforms D62 and D72, the eye pattern generator 18 generates the upper-part eye pattern D63 and the lower-part eye pattern D73 respectively from the output waveforms D62 and D72, and stores the generated patterns D63 and D73 into the memory (steps S62 and S72). The operation of the eye pattern generator 18 will be detailed below with reference to FIGS. 22A and 22B.

Then, the combiner 19 combines the upper-part eye pattern D63 and the lower-part eye pattern D73 to thereby generate the eye pattern D81 of the object circuit, and stores the eye pattern D81 into the memory (step S80). The operation of the combiner 19 will be detailed below with reference to FIGS. 23-25.

In the flow diagram of FIG. 7, a series of steps S60-S62 are carried out in parallel to a series of steps S70-S72. Alternatively, these series may be carried out in series.

3-2. Procedure of Calculation by the Propagation Delay Time Calculator

Figure 8:
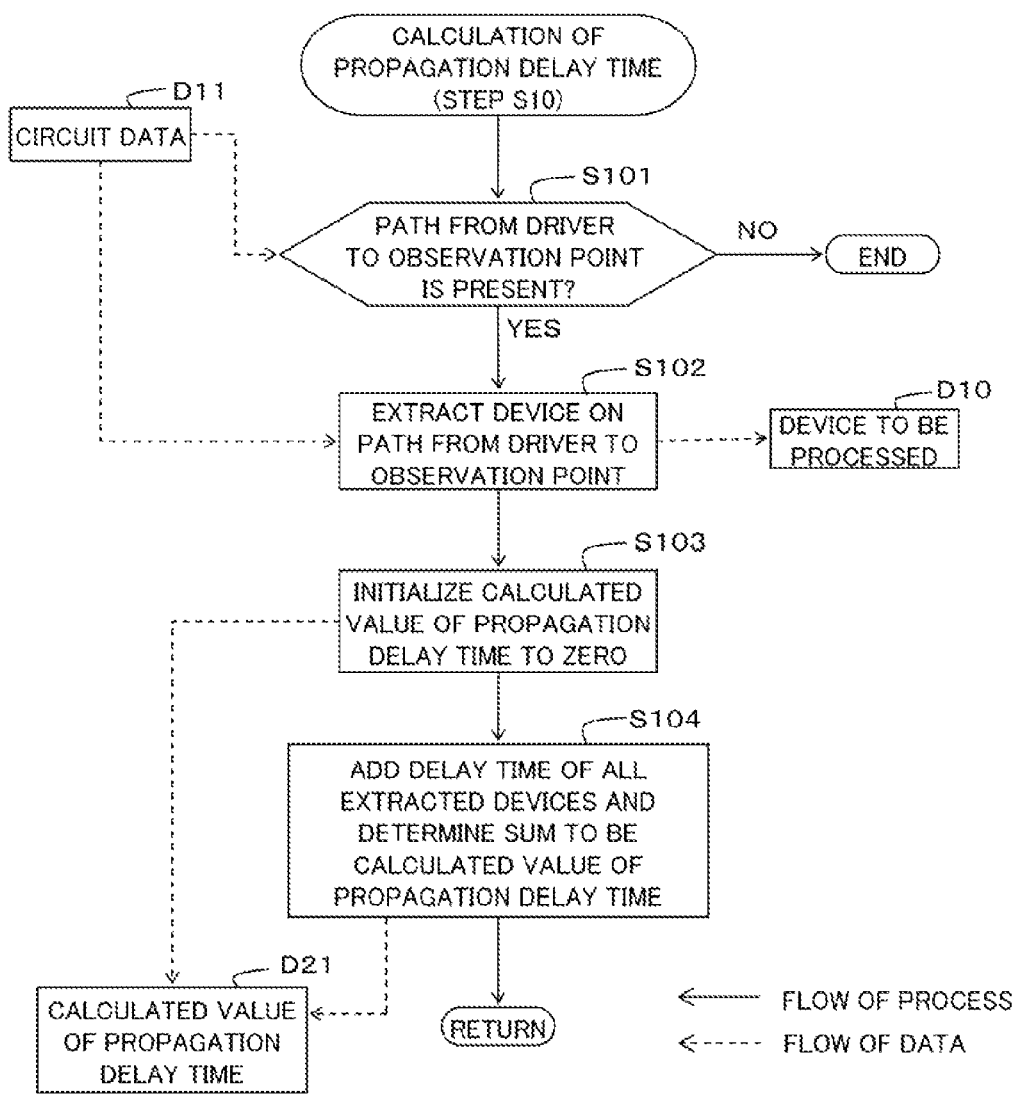
FIG. 8 is a flow diagram illustrating a succession of procedural steps of calculation by a propagation delay time calculator of FIG. 1.

The procedure (detailed procedure of step S10 in FIG. 7) of calculating the propagation delay time D21 by the propagation delay time calculator 11 will now be described with reference to a flow diagram (steps S101-S104) of FIG. 8.

Firstly, the propagation delay time calculator 11 refers to the circuit data D11 in the memory, and determines whether a path from the driver device to the observation point is present (step S101). If such a path is not present (NO route in step S101), an object circuit for which an eye pattern is to be generated is not present, and therefore the propagation delay time calculator 11 terminates the procedure.

If such a path is present (YES route in step S101), the propagation delay time calculator 11 extracts devices disposed on the path from the driver device to the observation point, and stores the extracted devices, as devices d10 to be processed, into the memory (step S102). After that, the propagation delay time calculator 11 initializes a region to store a calculated value D21 of the propagation delay time in the memory into "0" (step S103), calculates delay times of all the extracted devices d10 to be processed, totals all the calculated delay times, and stores the sum, as the calculated value D21 of propagation delay time, into the memory (step S104).

For example, if a path from the driver device DV1 to the observation point N2 is present as depicted in FIG. 6, the wiring data SEG1 and SEG2 are extracted as the devices d10 on the path from the driver device DV1 to the observation point N2. The propagation delay time of the wiring per unit length depends on the cross-sectional structure of the substrate. If the propagation delay time of the wiring per unit length is assumed to be 6 ns/m, the propagation delay time of SEG1=10 mm×6 ns/m=60 ps (picosecond); and the propagation delay time of SEG 2=1000 mm×6 ns/m=6000 ps.

Accordingly, the propagation delay time D21 representing a time from output a waveform from the output end N1 of the driver device DV1 to the arrival of the waveform at the observation point N2, the receiving end, is the sum of the propagation delay time of the SEG1 and that of the SEG2, that is, 60+6000=6060 ps=6.06 ns.

3-3. Procedure of Obtaining the Number of Longest Continuous Bits by the Obtaining Section The procedure (detailed step S20 in FIG. 7) of obtaining the number of longest continuous bits by the obtaining section 12 will now be described with reference to a flow diagram (steps S201-S211).

Figure 9:
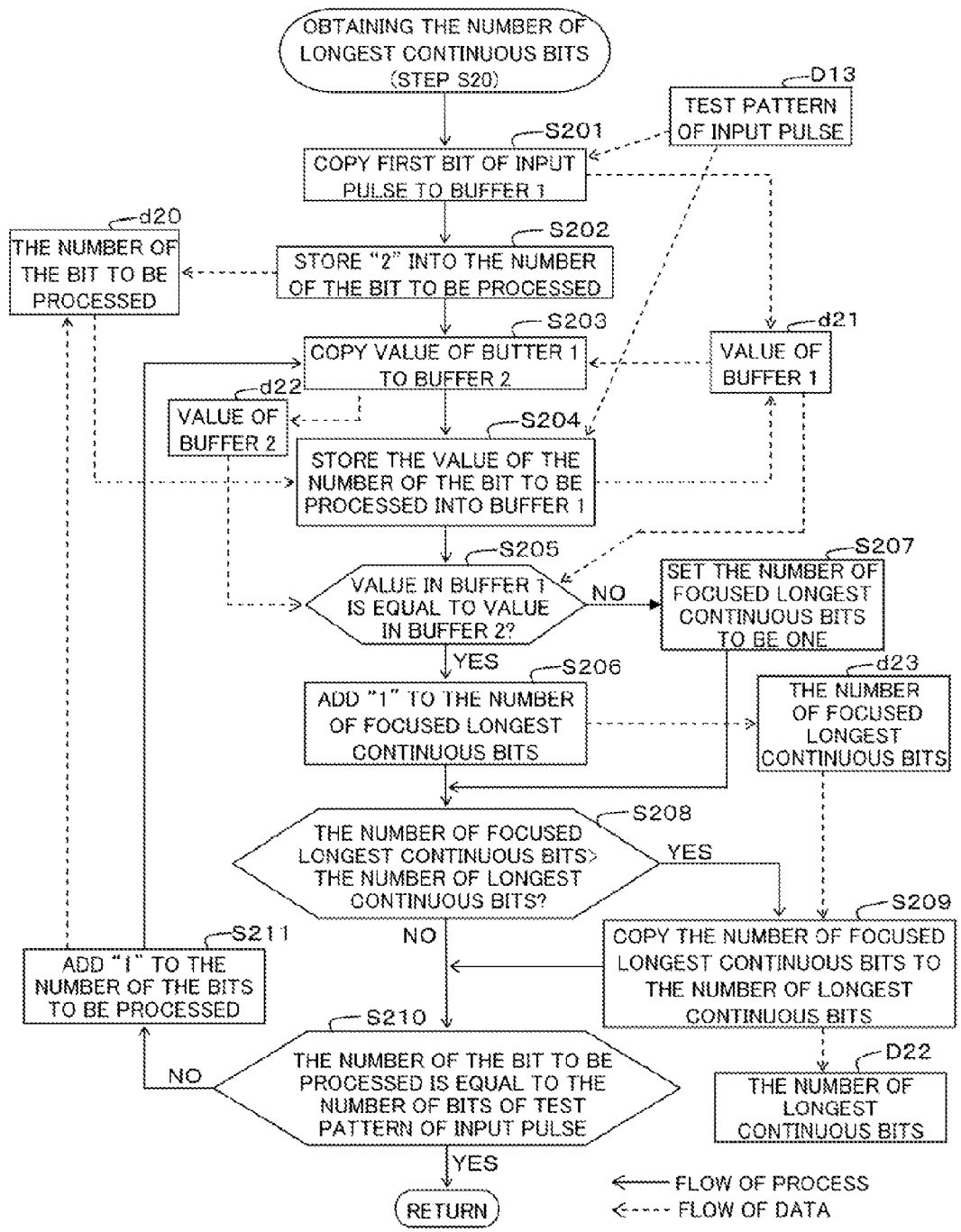
FIG. 9 is a flow diagram illustrating a succession of procedural steps of obtaining the number of longest continuous bits by an obtaining section of FIG. 1.

Firstly, the obtaining section 12 copies the first bit of the test pattern D13 of the input pulse to a buffer 1 of the memory (step S201; see d21 of FIG. 9). The obtaining section 12 also stores "2" to be the number of the bit to be processed into the memory (step S202; see d20 of FIG. 9).

Next, the obtaining section 12 copies the value d21 in the buffer 1 to a buffer 2 (step S203; see d22 in FIG. 9). The obtaining section 12 also reads the value of a bit specified by the number d20 of the bit to be processed from the test pattern D13 and stores the read value into the buffer 1, so that the value d21 in the buffer 1 can be rewritten (step S204).

After that, the obtaining section 12 determines whether the value d21 of the buffer 1 is equal to the value d22 of the buffer 2 (step S205). If the value d21 of the buffer 1 is equal to the value d22 of the buffer 2 (YES route in step S205), the obtaining section 12 adds "1" to the number d23 of longest focused continuous bits in the memory (step S206) and then moves to step S208. The number d23 of longest focused continuous bits is initially set to "1". On the other hand, if the value d21 of the buffer 1 is not equal to the value d22 of the buffer 2 (NO route in step S205), the obtaining section 12 resets the number d23 of longest focused continuous bits to "1" (step S207) and then moves to step S208.

Then, the obtaining section 12 determines whether the number d23 of longest focused continuous bits is larger than the number D22 of longest continuous bits in the memory (step S208). The initial value of the number D22 of longest continuous bits is set to "1". If the number d23 of longest focused continuous bits is larger than the number D22 of longest continuous bits (YES route in step S208), the obtaining section 12 copies the number d23 of longest focused continuous bits to the number D22 of longest continuous bits (step S209), so that the value of the number D22 of longest continuous bits is rewritten into the value of the number d23 of longest focused continuous bits. After that, the obtaining section 12 moves to step S210. On the other hand, if the number d23 of longest focused continuous bits is equal to or smaller than the number D22 of longest continuous bits, (NO route in step S208) the obtaining section 12 moves to step S210.

In step S210, the obtaining section 12 determines whether the number d20 of the bit to be processed is equal to the number of bits of the test pattern D13. If the number d20 of the bit to be processed is not equal to the number of bits of the test pattern D13 (NO route in step S210), the obtaining section 12 adds "1" to the number d20 of the bit to be processed (step S211), and returns to step S203. On the other hand, if the number d20 of the bit to be processed is equal to the number of bits of the test pattern D13 (YES route in step S210), the obtaining section 12 terminates the procedure.

The procedure of the flow diagram of FIG. 9 by the obtaining section 12 sets the number D22 of longest continuous bits to the number of longest continuous bits that continues the same value the longest in the test pattern D13.

For example, the above USB test pattern has seven continuous bits "1" and seven continuous bits "0" both at the longest. Carrying out the procedure of flow diagram FIG. 9 on the above test pattern, the obtaining section 12 obtains the value "7" for the number D22 of longest continuous bits.

3-4. Procedure of Analysis by the Step Response Analyzer

The procedure (detailed step S30 of FIG. 7) by the step response analyzer 13 will now be described with reference to the flow diagram (steps S301-S304) of FIG. 10.

Firstly, the step response analyzer 13 multiplies the number D22 of longest continuous bits by the time for one bit calculated from the operation frequency defined in the circuit operating condition D12 to thereby calculate the longest continuous bit time D31 (step S301). The longest continuous bit time D31 is the time for which the same value is continued the longest.

Then, the step response analyzer 13 calculates the step response analysis time d30 from the above expression of [input delay time of an input pulse]+longest continuous bit time D31]+[calculated value D21 of propagation delay time]×[margin coefficient] (step S302). Then the step response analyzer 13 analyzes, for the step response analysis time d30, a rising step response to a rising step signal (rising waveform) input into the object circuit to thereby obtain the result D32 of the analysis (step S303). The step response analyzer 13 also analyzes, for the step response analysis time d30, a falling step response to a falling step signal (falling waveform) input into the object circuit to thereby obtain the result D33 of the analysis (step S304). The steps S303 and S304 may be carried out in parallel as depicted in FIG. 10 or may be carried out in series.

Here, step response analysis will now be described assuming that the object circuit has the configuration of FIG. 6 and the test pattern D13 is the above pattern for USB.

The operation frequency is 500 MHz; the time for one-bit width is 1/(2×[operation frequency])=1 ns; the number D22 of longest continuous bits is seven; and the calculated value D21 of propagation delay time is 6.06 ns. Further assuming that the margin coefficient is 1.01, the step response analysis time d30 calculated in steps S301 and S302 is calculated by the following expression $$[\text{step response analysis time } d30] =$$
$$[\text{input delay time of an input pulse}] +$$
$$[\text{longest continuous bit time } D31] +$$
$$[\text{calculated value } D21 \text{ of propagation delay time}] \times$$
$$[\text{margin coefficient (predetermined value)}] =$$
$$1 \text{ ns} + 7 \times 1 \text{ ns} + 6.06 \text{ ns} \times 1.01 = 14.1206 \text{ ns}$$

In the steps S303 and S304, step responses to step waveforms input into the driver device DV1 of the circuit data D11 are analyzed, and received waveforms (response waveforms) at the observation node N2 are simulated. The step response analysis is carried out on both a rising step waveform and a falling step waveform, so that the result D32 of analyzing the rising step response and the result D33 of analyzing the falling step response are obtained.

The condition of analyzing a rising step response is:
 input signal (step waveform): pulse that continues bits "0" for the delay time (1 ns) of the input pulse followed by bits "1";
 analysis time: the step response analysis time d30 (14.1206 ns); and
 a response waveform at the observation point node N2 being to be stored, as the result D32 of analyzing the rising step response, into the memory.

The condition of analyzing a falling step response is:
 input signal (step waveform): pulse that continues bits "1" for the delay time (1 ns) of the input pulse followed by bits "0";
 analysis time: the step response analysis time d30 (14.1206 ns); and
 a response waveform at the observation point node N2 being to be stored, as the result D33 of analyzing the falling step response, into the memory.

Examples of the result D32 of analyzing the rising step response obtained under the above analysis condition are depicted in FIGS. 11A and 11B.

The result D32 of analyzing the rising step response includes definition data of an object to be analyzed as depicted in FIG. 11A and a result (response waveform at the observation point node N2), as depicted in FIG. 11B, of analysis on the object specified by the definition data of FIG. 11A.

As depicted in FIG. 11A, the definition data that specifies an object to be analyzed includes: a driver name; a receiver name; UP or Down; and an observation point node name. The term "UP and Down" represents whether the object to be analyzed is a rising or a falling. For example, the definition data of the result D32 of analyzing the rising step response of the circuit of FIG. 6 is, as depicted in FIG. 11A, the driver name "DV1"; the receiver name "RV1"; UP or Down "UP"; and the observation point node name "RV1_PIN(N2)".

The result of analyzing as depicted in FIG. 11B includes a response waveform at the observation point node N2 in the form of a voltage (in units of V) observed at the observation point node N2 every 10 ps from time 0. For example, FIG. 11B indicates that the observation point node N2 observes response waveform in the form of the voltage of 0V, 0V, 0V, 0V, 1.5V, 1.6V, and 3.3V at times 0 ps, 10 ps, 20 ps, 30 ps, 300 ps, 310 ps, and 1000 ps, respectively.

As the above, the result D32 of analyzing the rising step response is output in the form of tables as depicted in FIGS. 11A and 11B, and is stored in the memory. The result D33 of analyzing the falling step response is output in the form of similar tables to FIGS. 11A and 11B, and is stored in the memory.

As described above, a rising step response waveform to a rising step signal input and a falling step response waveform to a falling step signal input are obtained through simulation by the simulator 17 before the analysis of the step response analyzer 13.

3-5. Procedure of Determination by the Changing Start Time Determinator

A procedure (detailed step S40 in FIG. 7) of determination by the changing start time determinator 14 will now be detailed with reference to flow diagram (steps S401-S413) of FIG. 12.

The changing start time determinator 14 reads the result D32 of analyzing the rising step response or the result D33 of analyzing the falling step response from the memory, obtains a voltage d40 at time "0", and stores the voltage into the memory (step S401). The changing start time determinator 14 determines whether the current data to be processed is the result of rising analysis (step S402).

If the current data to be processed is the result of rising analysis (YES route in step S402), the changing start time determinator 14 stores the voltage d40 of the rising step response waveform (result D32 of analyzing) at time 0, to the DC voltage D44 in the Low state, into the memory (step S403). Then the changing start time determinator 14 calculates an origin check voltage d41 by adding the predetermined margin voltage to the DC voltage D44 in the Low state, and stores the calculated origin check voltage d41 into the memory (step S404).

If the current data to be processed is not the result of rising analysis, that is, if the current data to be processed is the result of falling analysis (NO route in step S402), the changing start time determinator 14 stores the voltage d40 of the falling step response waveform (the result D33 of analyzing) at time 0, as the DC voltage D43 in the High state, into the memory (step S405). Then the changing start time determinator 14 calculates an origin check voltage d41 by subtracting the predetermined margin voltage from the DC voltage D43 in the High state, and stores the origin check voltage d41 into the memory (step S406).

Upon the calculation of the origin check voltage d41, the changing start time determinator 14 obtains the voltage of the focused data from the result D32 of analyzing the rising step response or the result D33 of analyzing the falling step response, and stores the obtained voltage into the memory (step S407). Here, the voltage at the time of 10 ps is for the first time extracted as the voltage d42 of the focused data from the result D32 or D33 of analyzing, and for the second and the subsequent times a voltage of the time forwarded by 10 ps each time is obtained as the voltage d42 of the focused data from the result D32 and D33.

Upon the calculation of the voltage of the focused data, the changing start time determinator 14 determines again whether the current data to be processed is a result of rising analysis (step S408). If the current data to be processed is a result of rising analysis (YES route in step S408), the changing start time determinator 14 determines whether the voltage d42 of the focused data is larger than the origin check voltage d41 (step S409). If the voltage d42 of the focused data is larger than the origin check voltage d41 (YES route in step S409), the changing start time determinator 14 regards the time of the focused data, the time when the voltage d42 of the focused data is obtained in the result D32 of analyzing the rising step response, as the rising start time D41, which is then stored into the memory (step S410). Conversely, if the voltage d42 of the focused data is equal to or smaller than the origin check voltage d41 (NO route in step S409), the changing start time determinator 14 moves to step S412.

If the current data to be processed is not the result of rising analysis, that is, if the current data to be processed is the result of falling analysis (NO route in step S408), the changing start time determinator 14 determines whether the voltage d42 of the focused data is smaller than the origin check voltage d41 (step S411). If the voltage d42 of the focused data is smaller than the origin check voltage d41 (YES route in step S411), the changing start time determinator 14 regards the time of the focused data, that is, the time when the voltage d42 of the focused data is obtained in the result D33 of analyzing the falling step response, as the falling start time D42, which is then stored in the memory (step S410). If the voltage d42 of the focused data is equal to or larger than the origin check voltage d41 (NO route in step S411), the changing start time determinator 14 moves to step S412.

In step S412, the changing start time determinator 14 determines whether the data number of the focused data is equal to the number of data pieces contained in the result D32 or D33 of analyzing. If the data number of the focused data is not equal to the number of data pieces contained in the result D32 or D33 of analyzing (NO route in step S412), the changing start time determinator 14 determines the next focused data having the number of the data larger by one than the previous focused data (step S413), and returns to step S407. On the other hand, if the data number of the focused data is equal to the number of data pieces contained in the result D32 or D33 of analyzing (YES route in step 412), the changing start time determinator 14 terminates the procedure.

As the above, the DC voltage D43 in the High state and the DC voltage D44 in the Low state are obtained in the above manner using the results D32 and D33 of analyzing step responses. Furthermore, the rising start time D41 at which the rising step response waveform starts to rise at the observation point N2 is obtained on the basis of the result D32 of analyzing the rising step response, the DC voltage D44 in the Low state, and the margin voltage. Similarly, the falling start time D42 at which the falling step response waveform starts to fall at the observation point N2 is obtained on the basis of the result D33 of analyzing the falling step response, the DC voltage D43 in the High state, and the margin voltage.

3-6. Procedure of Checking an Amount of Reflection by the Checker

A procedure (detailed step S50 in FIG. 7) of checking an amount of reflection by the checker 15 will now be detailed along the flow diagram (step S501-S512) depicted in FIG. 13 with reference to FIG. 14. FIG. 14 is a waveform diagram to explain the procedure of checking an amount of reflection by the checker 15.

For initialization, the checker 15 sets a result D51 of checking an amount of reflection in the memory to "OK" (step S501). Furthermore, the checker 15 sets the time d50 of start checking an amount of reflection to the rising start time D41 or the falling start time D42 (step S502). If the data to be processed is the result D32 of analyzing the rising step response, the rising start time D41 is stored into the time d50 of start checking an amount of reflection while, if the data to be processed is the result D33 of analyzing the falling step response, the falling start time D42 is set in the time d50 of start checking an amount of reflection.

After the time D41 or D42 is stored in the time d50 of start checking an amount of reflection, the checker 15 extracts data at time 0 as the data to be processed from the result D32 or D33 (step S503) to determine whether data to be processed is present (step S504). If data to be processed is not preset (NO route in step S504), the checker 15 terminates the procedure.

If the data to be processed is present (YES route in step S504), the checker 15 determines whether the time of the data to be processed has passed the time d50 of start checking an amount of reflection (step S505). If the time of the data to be processed has passed the time d50 of start checking an amount of reflection (YES route in step S505), the checker 15 further determines whether the current data to be processed is the result of rising analysis (step S506).

If the current data to be processed is the result of rising analysis (YES route in step S506), the checker 15 determines whether the time of the data to be processed is equal to or later than the time t51 (see FIG. 14) that the response waveform D32 exceeds the DC voltage D43 in the High state for the first time after the waveform starts rising (step S507). If the time of the data to be processed is equal to or later than the time t51 (YES route in step S507), the checker 15 determines whether the voltage of the data to be processed is below a level L1 (see FIG. 14), which is obtained by subtracting a predetermined reflection allowable voltage D14 from the DC voltage D43 in the High state (step S508). If the voltage of the data to be processed is below the level L1 (YES route in step S508; see region X1 in FIG. 14), the checker 15 sets the result D51 of checking an amount of reflection from "OK" to "NG" (step S509), and terminates the procedure.

If the current data to be processed is not the result of rising analysis, that is, if the current data to be processed is the result of falling analysis (NO route in step S506), the checker 15 determines whether the time of the data to be processed is equal to or later than the time t52 (see FIG. 14) that the response waveform D33 comes below the DC voltage D44 in the Low state for the first time after the waveform starts falling (step S510). If the time of the data to be processed is equal to or later than the time t52 (YES route in step S510), the checker 15 further determines whether the voltage of the data to be processed exceeds a level L2 (see FIG. 14) obtained by adding a predetermined reflection allowable voltage D14 to the DC voltage D44 in the Low state (step S511). If the voltage of the data to be processed exceeds the level L2 (YES route in step S511, see the region X2 in FIG. 14), the checker 15 sets the result D51 of checking an amount of reflection from "OK" to "NG" (step S509), and terminates the procedure.

On the other hand, if the time of the data to be processed is equal to or earlier than the time d50 of start checking an amount of reflection (NO route in step S505), if the time of the data to be processed is earlier than the time t51 (NO route in step S507), if the voltage of the data to be processed is equal to or higher than the level L1 (NO route in step S508), if the time to the data to be processed is earlier than the time t52 (NO route in step S510), or if the voltage of the data to be processed is equal to or lower than the level L2 (NO route in step S511), the checker 15 extracts next data to be processed after the current data from the result D32 or D33 of analyzing (step S512), and moves to step S504. Providing that the result D32 or D33 corresponds to FIG. 11B, the next data is the data of 10-ps later than the current data.

If the result of step S504 is determined to be NO because the checker 15 completes process on all the data of the results D32 and D33 without undergoing step S509, the result D51 of checking an amount of reflection is finally set to "OK".

If the response waveform D32 comes below the level L1 (=[DC voltage D43 in High state]−[reflection allowable voltage D14] at or after the time t51 (see FIG. 14) that the response waveform D32 exceeds the DC voltage D43 in the High state for the first time after the waveform starts rising (see the region X1 in FIG. 14), the amount of reflection is determined to largely exceed the allowable value and therefore the result D51 of checking an amount of reflection is set to "NG".

Similarly, the response waveform D33 exceeds the level L2 (=[DC voltage D44 in Low state]+[reflection allowable voltage D14]) at or after the time t52 (see FIG. 14) that the response waveform D33 comes below the DC voltage D44 in the Low state for the first time after the waveform starts falling (see the region X2 in FIG. 14), the reflection is determined to be largely to exceed the allowable value, so that the result D51 of checking an amount of reflection is set to "NG".

If the result D51 of checking an amount of reflection is NG, the checker 15 displays "unavailability of high-speed transmission" for the notification to the user (step S52 in FIG. 7), and terminates the process for the object circuit. On the other hand, if the result D51 of checking an amount of reflection is OK, the eye pattern generating device 1 instructs the test pattern generator 16 to carry out ensuing process (steps S60 and S70; see FIGS. 15 and 16).

In the above manner, the presence of large reflection is checked using the results (response waveform) D32 and D33 of analyzing the step responses. In the event of the presence of large reflection, the object circuit does not handle high-speed transmission and therefore needs a change in design to reduce the prospective reflection, which is notified to the user through the display 53. If the reflection is determined to be large, the subsequent process is not carried out, so that unneeded analysis can be prohibited.

3-7. Procedure of Generating Upper- and Lower-Part Test Patterns

3-7-1. Procedure of Generating an Upper-Part Test Pattern of an Eye:

A procedure (detailed step S60 in FIG. 7) of generating an upper-part test pattern D61 by the test pattern generator 16 will now be detailed with reference to flow diagram (steps S601-S613) of FIG. 15. An upper-part test pattern D61 of an eye defines an upper-part shape of an eye of an eye pattern (see FIG. 5), and aims at obtaining an upper part of the eye in short time.

Figure 17:
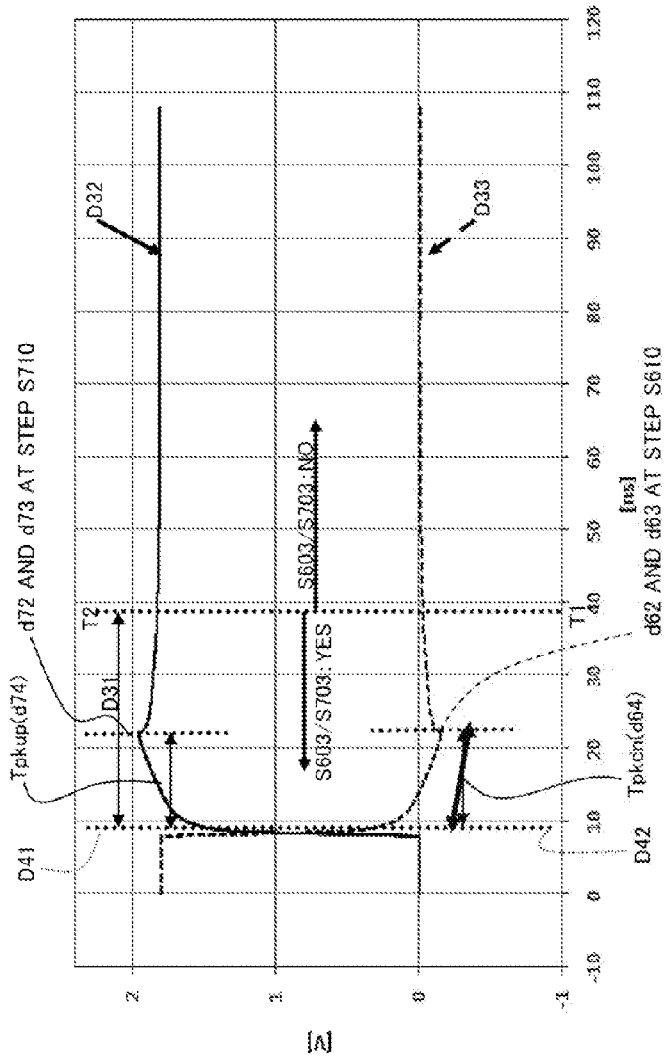
FIG. 17 is a waveform diagram illustrating a succession of procedural steps of generating upper- and lower-part test patterns of an eye of the test pattern generator of FIG. 1.

The following description will be made with reference to FIGS. 17, 18A, 19, and 20A. FIGS. 17 and 19 are waveform diagrams to explain the procedure of generating an upper-part test pattern D61 of an eye by the test pattern generator 16. FIGS. 18A and 20A are upper-part test patterns D61 generated under states corresponding to FIGS. 17 and 19, respectively. FIGS. 17 and 19 enlarge the margins of the analysis time to easily specify the step response waveforms. However, an actual analysis time ends at immediately after the longest continuous bit time D31.

The test pattern generator 16 obtains time of the focused data from the result D33 of analyzing the falling step response, and stores the obtained time, as a time d60, into the memory (step S601). The time of the focused data at the start of processing is 0. If the result D33 of analyzing the falling step response corresponds to FIG. 11B, the time d60 sequentially increases by 10 ps in step S601 each time next focused data is selected in step S609, which will be detailed below.

Upon obtaining the time d60 of the focused data, the test pattern generator 16 determines whether the time d60 of the focused data exceeds the falling start time D42 (step S602). If the time d60 of focused data is equal to or earlier than the falling start time D42 (NO route in step S602), the test pattern generator 16 sequentially selects the next focused data in the order of data number (step S609), and moves to step S601. If the time d60 of the focused data exceeds the falling start time D42 (YES route in step S602), the test pattern generator 16 further determines whether the time d60 of the focused data reaches time T1 (see FIGS. 17 and 19) which is the sum of the falling start time D42 and the longest continuous bit time D31 (step S603; see FIGS. 17 and 19).

If the time d60 of the focused data is no later than the time T1 (YES route in step S603), the test pattern generator 16 obtains the voltage of the current focused data from the result D33 of analyzing the falling step response, and stores the obtained voltage, as a voltage d61, into the memory (step S604). After the voltage d61 of the focused data is obtained, the test pattern generator 16 determines whether the voltage d61 of the focused data is smaller than the minimum voltage d62 (step S605). The minimum voltage d62 is set in the memory, and the initial value of the minimum voltage d62 is set to ∞.

If the voltage d61 of the focused data is smaller than the minimum voltage d62 (YES route in step S605), the test pattern generator 16 sets the minimum voltage d62 to the voltage d61 of the current focused data (step S606), and sets the falling peak time d63 in the memory to the time d60 of the current focused data (step S607). After the falling peak time d63 is set to the time d60 of the focused time, or if the voltage d61 of the focused data is equal to or larger than the minimum voltage d62 (NO route in step S605), the test pattern generator 16 determines whether the data number of the focused data is equal to the number of data pieces contained in the result D33 of analyzing the falling step response (step S608).

If the data number of the focused data is not the same as the number of data pieces of the result D33 of analyzing (NO route in step S608), the test pattern generator 16 selects the next focused data having the subsequent data number (step S609), and moves to step S601. If the data number of the focused data is the same as the number of data pieces of the result D33 of analyzing (YES route in step S608), the test pattern generator 16 sets the falling peak time width d64 in the memory to [the falling peak time d63]-[the falling start time D42] (step S610). The falling peak time width d64 set in this step is a time Tpkdn that the voltage takes to reach the peak since the waveform of the falling step response start changing, and the relationship [the falling peak time width d64]< [the longest continuous bit time D31] (see FIG. 17).

If the time d60 of the focused data is determined in step S603 to reach the time T1 (=[the falling start time D42]+[longest continuous bit time D31]) before the response waveform D33 reaches the minimum voltage (i.e., the peak) (NO route; see FIG. 19), the test pattern generator 16 sets the falling peak time width d64 to [the falling peak time d63]-[the falling start time D42] (step S610). Since then [the falling peak time d63] is the same as or is substantially the same as the above time T1(=[falling start time D42]+[longest continuous bit time D31]), the falling peak time width d64 set in step S610 is [time T1]-[the falling start time D42], which is the same as or substantially the same as the longest continuous bit time D31. Namely, the falling peak time width d64 comes to be the longest continuous bit time D31, and therefore the relationship [the above time Tpkdn]≥[the falling peak time width d64][the longest continuous bit time D31] is satisfied (see FIG. 19).

After the falling peak time width d64 is set, the test pattern generator 16 determines whether the falling peak time width d64 is smaller than the longest continuous bit time D31 (step S611). If the falling peak time width d64 is smaller than the longest continuous bit time D31 (YES route in step S611; see FIG. 17), the test pattern generator 16 generates the following upper-part test pattern D61 using the falling peak time width d64 (=Tpkdn) (step S612), and terminates the procedure.

Specifically, the test pattern generator 16 generates the upper-part test pattern D61 having a pattern (unit pattern), which continues a number of bits "0" as many as a number corresponding to the falling peak time width Tpkdn after one bit "1", twice. In other words, the upper-part test pattern D61 has a bit string of: "1" for 1-bit time, "0" for Tpkdn time, "1" for 1-bit time, and "0" for Tpkdn time. Providing that Tpkdn=14 ns and a time of one-bit width is 1 ns, the upper-part test pattern D61 has a bit string of FIG. 18A, that is, "1" for 1 ns (one bit of "1"), "0" for 14 ns (14 bits of "0"), "1" for 1 ns (one bit of "1"), and "0" for 14 ns (14 bits of "0")="10000000000000100000000000000".

The reason that the upper-part test pattern D61 of FIG. 18A has repeating a unit pattern including a bit "1" for one-bit time and bits "0" for the Tpkdn time twice is to include a rising pulse P11, which generates the worst case of an upper-part of an eye as depicted by the reference symbol "P" in FIG. 4B, in the upper-part test pattern D61. The presence of one-bit rising pulse P11 following bits "0" for the Tpkdn time causes the waveform to fluctuate at a short bit width under a state of the voltage level of the waveform at the lowest of the Low end. Accordingly, the upper-part test pattern D61 of FIG. 18A is expected to cause the worst case of the upper part of an eye due to inter-symbol interference, so that an upper-part test pattern D61 which can obtain the upper part of an eye of the worst case in a short time is generated.

If the falling peak time width d64 is equal to or longer than the longest continuous bit time D31 (NO route in step S611; see FIG. 19), the test pattern generator 16 generates the following upper-part test pattern D61 using the longest continuous bit time D31 (step S613), and terminates the procedure.

Specifically, the test pattern generator 16 generates the upper-part test pattern D61 having a pattern (unit pattern), which continues a number of bits "0" as many as a number corresponding to the longest continuous bit time D31 after one bit "1", twice. In other words, the upper-part test pattern D61 has a bit string of: "1" for 1-bit time, "0" for the longest continuous bit time, "1" for 1-bit time, and "0" for the longest continuous bit time. For example, since the above USB test pattern defines the longest continuous bit time D31=7 ns (i.e., the number D22 of longest continuous bits=7) and a time of one-bit width is 1 ns, the upper-part test pattern D61 has a bit string of FIG. 20A, that is, "1" for 1 ns (one bit of "1"), "0" for 7 ns (seven bits of "0"), "1" for 1 ns (one bit of "1"), and "0" for 7 ns (seven bits of "0")="1000000010000000".

The reason that the upper-part test pattern D61 of FIG. 20A has repeating a unit pattern including a bit "1" for one-bit time and bits "0" for the longest continuous bit time twice is, similarly to that of FIG. 18A, to include a rising pulse P12, which generates the worst case of an upper-part of an eye as depicted by the reference symbol "P" in FIG. 4B, in the upper-part test pattern D61. At that time, the relationship [the above time Tpkdn][longest continuous bit time D31] is satisfied. For the above, the minimum voltage of the response waveform to input of the above USB test pattern into an object circuit does not reach the minimum value of the result D33 of analyzing the falling step response, and is the voltage at the time T1 (=[the falling start time D42]+[the longest continuous bit time D31]) of FIG. 19. Therefore, there is no need to consider the result D33 of analyzing the falling step response at and after the time T1. The presence of one-bit rising pulse P12 after succession bits "0" for the longest continuous time (i.e. seven "0" bits) causes the waveform to fluctuate at a short bit width under a state of the voltage level of the waveform at the lowest of the Low end. Accordingly, the upper-part test pattern D61 of FIG. 20A is expected to cause the worst case of the upper part of an eye due to inter-symbol interference, so that an upper-part test pattern which can obtain the upper part of an eye of the worst case in a short time is generated.

3-7-2. Procedure of Generating a Lower-Part Test Pattern of an Eye:

A procedure (detailed step S70 in FIG. 7) of generating a lower-part test pattern D71 by the test pattern generator 16 will now be detailed with reference to flow diagram (steps S701-S713) of FIG. 16. A lower-part test pattern D71 of an eye defines a lower-part shape of an eye of an eye pattern (see FIG. 5) and aims at obtaining a lower part of the eye in short time.

The following description will be made with reference to FIGS. 17, 18B, 19, and 20B. FIGS. 17 and 19 are waveform diagrams to explain the procedure of generating a lower-part test pattern D71 of an eye by the test pattern generator 16. FIGS. 18B and 20B are lower-part test patterns D71 generated under states corresponding to FIGS. 17 and 19, respectively. FIGS. 17 and 19 enlarge the margins of the analysis time to easily specify the step response waveforms as described above. However, an actual analysis time ends at immediately after the longest continuous bit time D31.

The test pattern generator 16 obtains time of the focused data from the result D32 of analyzing the rising step response, and stores the obtained time, as a time d70, into the memory (step S701). The time of the focused data at the start of processing is 0. If the result D32 of analyzing the rising step response corresponds to FIG. 11B, the time d70 sequentially increases by 10 ps in step 701 each time next focused data is selected in step S709, which will be detailed below.

Upon obtaining the time d70 of the focused data, the test pattern generator 16 determines whether the time d70 of the focused data exceeds the rising start time D41 (step S702). If the time d70 of focused data is equal to or earlier than the rising start time D41 (NO route in step 702), the test pattern generator 16 sequentially selects focused data in the order of data number (step S709), and moves to step S701. If the time d70 of the focused data exceeds the rising start time D41 (YES route in step S702), the test pattern generator 16 further determines whether the time d70 of the focused data reaches time T2 (see FIGS. 17 and 19) which is the sum of the rising start time D41 and the longest continuous bit time D31 (step S703; see FIGS. 17 and 19).

If the time d70 of the focused data is no later than the time T2 (YES route in step S703), the test pattern generator 16 obtains the voltage of the current focused data from the result D32 of analyzing the rising step response, and stores the obtained voltage, as a voltage d71, into the memory (step S704). After the voltage d71 of the focused data is obtained, the test pattern generator 16 determines whether the voltage d71 of the focused data is larger than the maximum voltage d72 (step S705). The maximum voltage d72 is set in the memory, and the initial value of the maximum voltage d72 is set to $-\infty$.

If the voltage d71 of the focused data is larger than the maximum voltage d72 (YES route in step S705), the test pattern generator 16 sets the maximum voltage d72 to the voltage d71 of the current focused data (step S706), and sets the rising peak time d73 in the memory to the time d70 of the current focused data (step S707). After the rising peak time d73 is set to the time d70 of the focused time, or if the voltage d71 of the focused data is equal to or smaller than the maximum voltage d72 (NO route in step S705), the test pattern generator 16 determines whether the data number of the focused data is equal to the number of data pieces contained in the result D32 of analyzing (step S708).

If the data number of the focused data is not the same as the number of data pieces of the result D32 of analyzing (NO route in step S708), the test pattern generator 16 selects the next focused data having the subsequent data number (step S709), and moves to step S701. If the data number of the focused data is the same as the number of data pieces of the result D32 of analyzing (YES route in step S708), the test pattern generator 16 sets the rising peak time width d74 to [the rising peak time d73]-[the rising start time D41] (step S710). The rising peak time width d74 set in this step is a time Tpkup that the voltage takes to reach the peak since the waveform of the rising step response starts changing, and the relationship [the rising peak time width d74]<[the longest continuous bit time D31] is satisfied (see FIG. 17).

If the time d70 of the focused data is determined in step S703 to reach the time T2 (=[the rising start time D41]+[longest continuous bit time D31]) before the response waveform D32 reaches the maximum voltage (i.e., the peak) (NO route; see FIG. 19), the test pattern generator 16 sets the rising peak time width d74 to [the rising peak time d73]−[the rising start time D41] (step S710). Since then [the rising peak time d73] is the same as or is substantially the same as the above time T2(=[rising start time D41]+[longest continuous bit time D31]), the rising peak time width d74 set in step S710 is [time T2]−[the rising start time D41], which is the same as or substantially the same as the longest continuous bit time D31. Namely, the rising peak time width d74 comes to be the longest continuous bit time D31, and therefore the relationship [the above time Tpkup]≥[the rising peak time width d74]≥[the longest continuous bit time D31] is satisfied (see FIG. 19).

After the rising peak time width d74 is set, the test pattern generator 16 determines whether the rising peak time width d74 is smaller than the longest continuous bit time D31 (step S711). If the rising peak time width d74 is smaller than the longest continuous bit time D31 (YES route in step S711; see FIG. 17), the test pattern generator 16 generates the following lower-part test pattern D71 using the rising peak time width d74 (=Tpkup) (step S712), and terminates the procedure.

Specifically, the test pattern generator 16 generates the lower-part test pattern D71 having a pattern (unit pattern), which continues a number of bits "1" as many as a number corresponding to the rising peak time width Tpkup after one bit "0", twice. In other words, the lower-part test pattern D71 has a bit string of: "0" for 1-bit time, "1" for Tpkup time, "0" for 1-bit time, and "1" for Tpkup time. Providing that Tpkup=14 ns and a time of one-bit width is 1 ns, the lower-part test pattern D71 has a bit string of FIG. 18B, that is, "0" for 1 ns (one bit of "0"), "1" for 14 ns (14 bits of "1"), "0" for 1 ns (one bit of "0"), and "1" for 14 ns (14 bits of "1")="01111111111111011111111111111".

The reason that the lower-part test pattern D71 of FIG. 18B has repeating a unit pattern including a bit "0" for one-bit time and bits "1" for the Tpkup time twice is to include a falling pulse P21, which generates the worst case of an lower part of an eye, in the lower-part test pattern D71. The presence of one-bit rising pulse P21 after bits "1" for the Tpkup time causes the waveform to fluctuate at a short bit width under a state of the voltage level of the waveform at the highest of the High end. Accordingly, the lower-part test pattern D71 of FIG. 18B is expected to cause the worst case of the lower part of an eye due to inter-symbol interference, so that an lower-part test pattern D71 which can obtain the upper part of an eye of the worst case in a short time is generated.

If the rising peak time width d74 is equal to or longer than the longest continuous bit time D31 (NO route in step S711; see FIG. 19), the test pattern generator 16 generates the following lower-part test pattern D71 using the longest continuous bit time D31 (step S713), and terminates the procedure.

Specifically, the test pattern generator 16 generates the lower-part test pattern D71 having a pattern (unit pattern), which continues a number of bits "1" as many as a number corresponding to the longest continuous bit time D31 after one bit "0", twice. In other words, the lower-part test pattern D71 has a bit string of: "0" for 1-bit time, "1" for the longest continuous bit time, "0" for 1-bit time, and "1" for the longest continuous bit time. For example, since the above USB test pattern defines the longest continuous bit time D31=7 ns (i.e., the number D22 of longest continuous bits=7) and a time of one-bit width is 1 ns, the lower-part test pattern D71 has a bit string of FIG. 20B, that is, "0" for 1 ns (one bit of "0"), "1" for 7 ns (seven bits of "1"), "0" for 1 ns (one bit of "0"), and "1" for 7 ns (seven bits of "1")="01111111101111111".

The reason that the lower-part test pattern D71 of FIG. 20B has repeating a unit pattern including a bit "0" for one-bit time and bits "1" for the longest continuous bit time twice is, similarly to that of FIG. 18B, to include a falling pulse P22, which generates the worst case of a lower-part of an eye, in the lower-part test pattern D71. At that time, the relationship [the above time Tpkup]≥[longest continuous bit time D31] is satisfied. For the above, the maximum voltage of the response waveform to input of the above USB test pattern into an object circuit does not reach the maximum value of the result D32 of analyzing the rising step response, and is the voltage at the time T2 (=[the rising start time D41]+[the longest continuous bit time D31]) of FIG. 19. Therefore, there is no need to consider the result D32 of analyzing the rising step response at and after the time T2. The presence of one-bit falling pulse P22 after bits "1" for the longest continuous time (i.e. seven "1" bits) causes the waveform to fluctuate at a short bit width under a state of the voltage level of the waveform at the highest of the High end. Accordingly, the lower-part test pattern D71 of FIG. 20B is expected to cause the worst case of the lower part of an eye due to inter-symbol interference, so that a lower-part test pattern which can obtain the lower part of an eye of the worst case in a short time is generated.

3-8. Operation of the Simulator

Upon the generation of the upper-part test pattern D61 and lower-part test pattern D71 in the above manner, the simulator 17 simulates output waveforms (response waveforms observed at the observation point N2) from the object circuit when the upper-part test pattern D61 and lower-part test pattern D71 are input into the object circuit. The simulator 17 continues the simulation for the simulation analysis time calculated in the above manner.

Figure 21A:
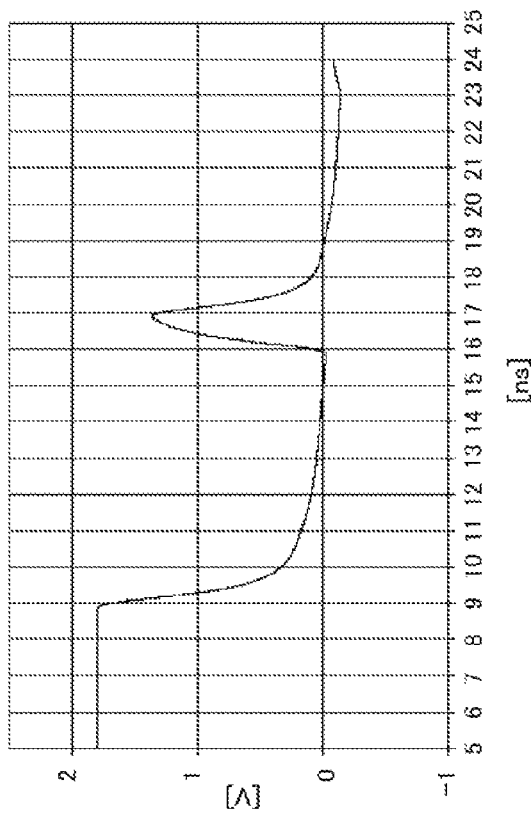
FIGS. 21A and 21B are diagrams illustrating results of simulation of an output waveforms (response waveforms) from an object circuit when the upper-part test pattern and the lower-part test pattern of FIGS. 20A and 20B are input into the object circuit to be simulated.
Figure 21B:
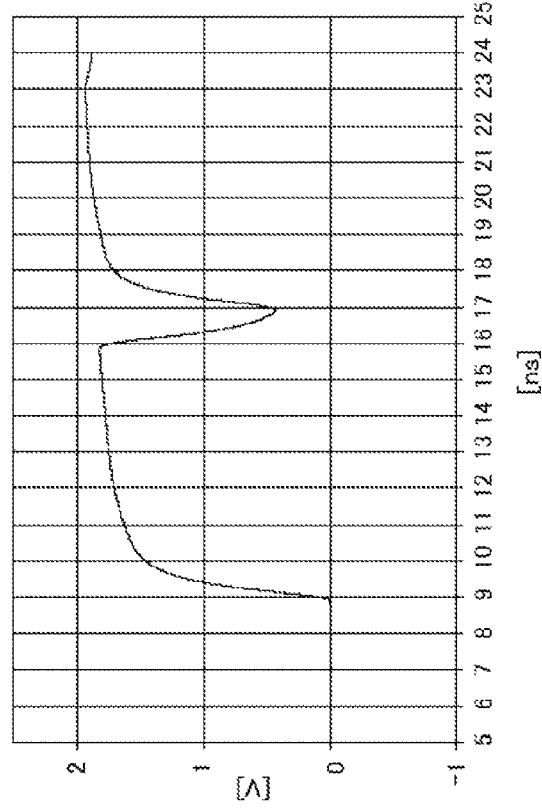

The simulation using the upper-part test pattern D61 denoted in FIG. 20A results in, for example, a response waveform (output waveform, transient analyzed waveform) depicted in FIG. 21A while the simulation using the lower-part test pattern D71 denoted in FIG. 20B results in, for example, a response waveform (output waveform, transient analyzed waveform) depicted in FIG. 21B. Likewise the results D32 and D33 of analyzing, the result (response waveform) D62 of the upper-part simulation and the result (response waveform) D72 of the lower-part simulation are output in the form of tables exemplified by those of FIGS. 11A and 11B, and are stored into the memory (steps S61 and S71).

3-9. Operation of the Eye Pattern Generator

Upon obtaining the above output waveforms D62 and D72, the eye pattern generator 18 generates an upper-part eye pattern D63 of FIG. 22A and a lower-part eye pattern D73 of FIG. 22B respectively from the output waveforms D62 and D72, and stores the generated patterns D63 and D73 into the memory (steps S62 and S72).

The upper-part eye pattern D63 of FIG. 22A is formed by overlaying waveforms sampled from the output waveform D62 of FIG. 21A in units of a frame having a 2-ns width. In the same manner, the lower-part eye pattern D73 of FIG. 22B is formed by overlaying waveforms sampled from the output waveform D72 of FIG. 21B in units of a frame having a 2-ns width.

3-10. Operation of the Combiner

The combiner 19 combines the upper-part eye pattern D63 of FIG. 22A and the lower-part eye pattern D73 of FIG. 22B to thereby generates an eye pattern D81 of the object circuit as depicted in FIG. 23, and stores the eye pattern D81 into the memory (step S80). The eye pattern D81 of FIG. 23 is based on a 16-bit upper-part test pattern D61 of FIG. 20A and a 16-bit lower-part test pattern D71 of FIG. 20B.

Figure 25:
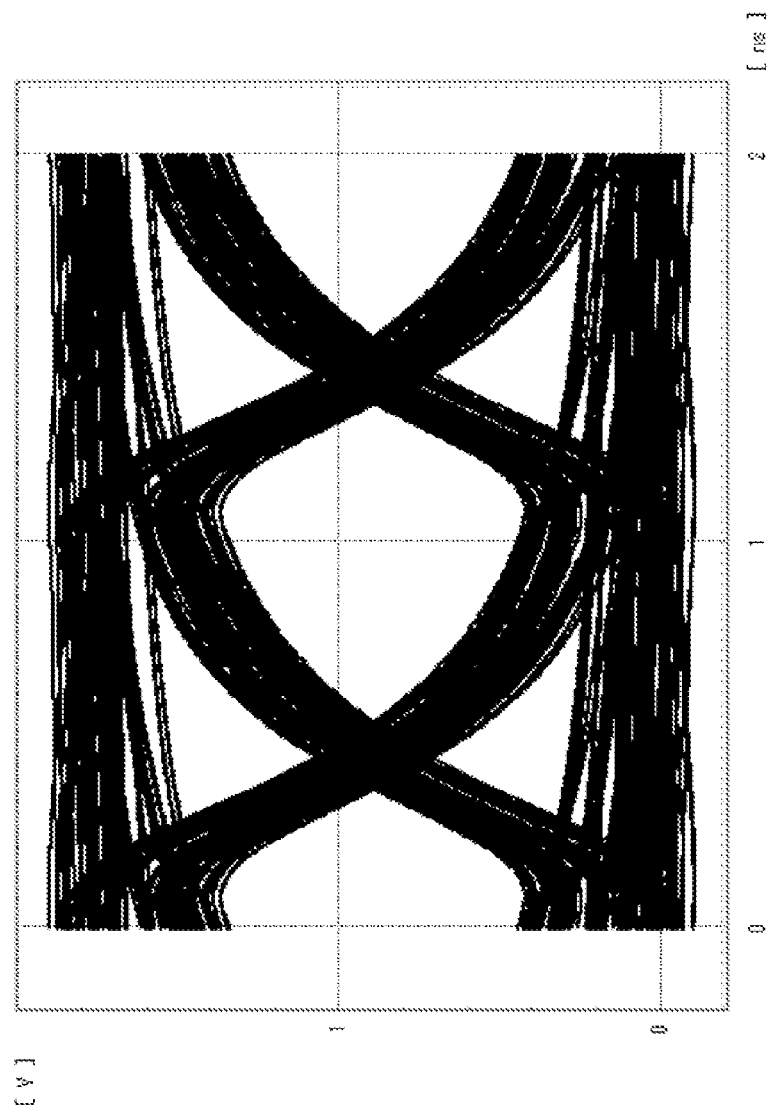
FIG. 25 is a diagram illustrating a typical eye pattern.
Figure 27:
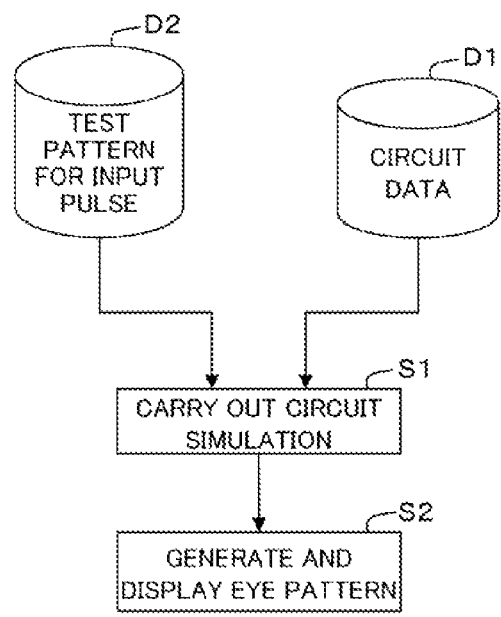
FIG. 27 is a flow diagram illustrating a typical procedure of generating an eye pattern through a simulation.

Here, FIG. 25 depicts a typical eye pattern generated in a conventional technique using a 512-bit USB test pattern detailed as the above.

Figure 24:
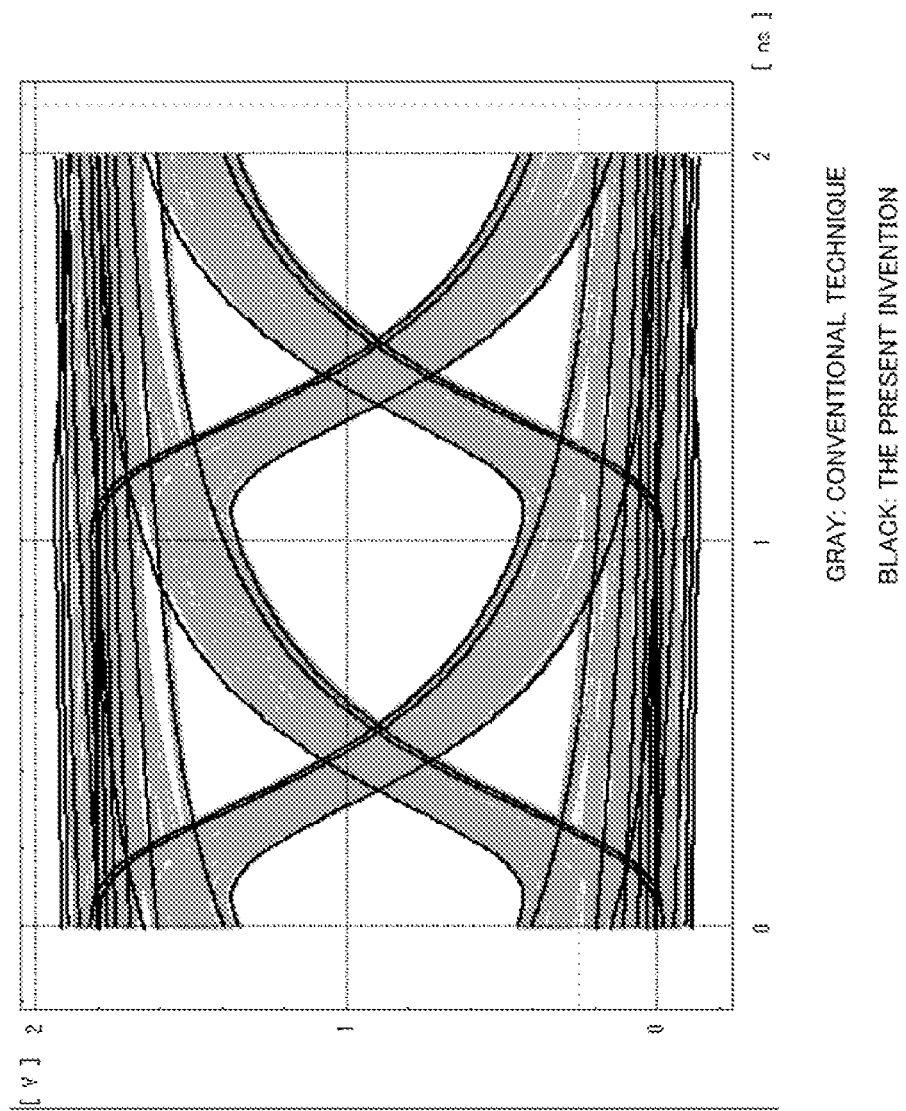
FIG. 24 is a diagram overlaying the eye pattern (FIG. 23) of an object circuit obtained by the eye pattern generating device of the first embodiment and an eye pattern (FIG. 25) of the same circuit obtained in a conventional technique.

The eye pattern of FIG. 25 overlaid on the eye pattern D81 of FIG. 23 obtained by the eye pattern generating device 1 of the first embodiment is depicted in FIG. 24. As illustrated in FIG. 24, the eye pattern D81 of FIG. 23 obtained by the eye pattern generating device 1 of the first embodiment has a degree of opening of the eye substantially the same as that of the eye pattern of FIG. 25 obtained by a conventional technique.

3-11. Effects

As described above, the eye pattern generating device 1 of the present invention can check influence of reflection including transmission loss through step response analysis on the object circuit. Then the upper- and lower-part test patterns D61 and D71, which can efficiently obtain the worst case of the inner shape of an eye pattern, are generated on the basis of the result of the check and the number D22 of longest continuous bits of the prescribed test pattern D13 (e.g., the above USB test pattern) for generating an eye pattern.

Using the above upper- and lower-part test patterns D61 and D71, which generates the worst cases of the upper part and the lower part of an eye in a short time, the eye pattern D81, which has an inner shape of the worst case, can be generated rapidly and precisely. Accordingly, an eye pattern of an object circuit can be verified rapidly and precisely.

The upper- and lower-part test patterns D61 and D71 for generating the eye pattern D81 are each 16-bit data, which is much less than the prescribed test pattern D13 (e.g., the above 512-bit USB test pattern) for generating an eye pattern. Consequently, an amount of data of response waveforms obtained as a result of the circuit simulation and an amount of data of an eye pattern obtained from the response waveforms can be largely reduced, so that the memory of the eye pattern generating device 1 can be efficiently used.

According to the eye pattern generating device 1 of the first embodiment, the presence of large reflection is checked on the basis of the results (response waveforms) D32 and D33 of analyzing step responses, and if large reflection is present, the fact is notified to the user through the display 53. An object circuit having a large amount of reflection is incapable of high-speed transmission, and therefore needs change in design, which is also notified to the user through the display 53. Besides, under the presence of large reflection, not carrying out the subsequent process prohibits unnecessary analysis processing.

The analysis time (simulation analysis time) for generating an eye pattern by a conventional technique and that by the eye pattern generating device 1 of the first embodiment can be compared as follows. Here, the object circuit is assumed to be the circuit of FIG. 6 and the prescribed test pattern is the above 512-bit USB test pattern. The time of one-bit width is 1 ns, the input delay time of an input pulse is 1 ns, and the margin coefficient (predetermined factor) is 1.01 the same as the above example.

[Analysis time by a conventional technique] =

[input delay time of an input pulse] +

[the number of bits of the USB test pattern] ×

[time of one-bit width] + [propagation delay time] ×

[margin coefficient] = 1 ns + 512 × 1 ns + 6.06 ns × 1.01 = 519.1206 ns

[rising step response analysis time $t1$ in the first embodiment] =

[input delay time of an input pulse] + [longest continuous bit time] +

[propagation delay time] × [margin coefficient] =

-continued $$1\text{ ns} + 7 \times 1\text{ ns} + 6.06\text{ ns} \times 1.01 = 14.1206\text{ ns}$$

[falling step response analysis time $t2$ in the first embodiment] =

[input delay time of an input pulse] + [longest continuous bit time] +

[propagation delay time] × [margin coefficient] =

$$1\text{ ns} + 7 \times 1\text{ ns} + 6.06\text{ ns} \times 1.01 = 14.1206\text{ ns}$$

[simulation analysis time $t3$ of an upper-part test pattern in the first embodiment] =

[the number of bits of the upper-part test pattern] ×

[time of one-bit width] + [propagation delay time] ×

[margin coefficient] = $(1 + 7 + 1 + 7) \times 1$ ns + 6.06 ns × 1.01 =

22.1206 ns (time of worst case)

[simulation analysis time $t4$ of a lower-part test pattern in the first embodiment] =

[the number of bits of the lower-part test pattern] ×

[time of one-bit width] + [propagation delay time] ×

[margin coefficient] = $(1 + 7 + 1 + 7) \times 1$ ns +

6.06 ns × 1.01 = 22.1206 ns

[total analysis time that the eye pattern generating device 1 of the first embodiment takes] =

$$t1 + t2 + t3 + t4 = 72.4824\text{ ns}$$

As the above, the total analysis time that the eye pattern generating device 1 of the first embodiment takes is about one-seventh the analysis time of the conventional technique. This means that the eye pattern generating device 1 of the first embodiment can largely reduce an amount of data involved in the analysis.

4. Others

A preferred embodiment of the present invention is detailed as the above. The present invention should by no means be limited to the first embodiment, and various changes and modifications can be suggested without departing from the sprit of the present invention.

The entire or part of the function as the propagation delay time calculator 11, the obtaining section 12, the step response analyzer 13, the changing start time determinator 14, the checker 15, the test pattern generator 16, the simulator 17, the eye pattern generator 18, and combiner 19 is carried out by a computer (including a CPU, an information processor, and a various terminal) executing a predetermined application program (a circuit simulator program (eye pattern generating program)).

The program is provided in the form being stored in a non-transitory computer readable recording medium such as a flexible disk, a CD (e.g., CD-ROM, CD-R, CD-RW), a DVD (e.g., DVD-ROM, DVD-RAM, DVD-R, DVD-RW, DVD+R, DVD+RW), and a Blu-ray disc. In this case, the computer reads the program from the recording medium and forwards and stores the program into an internal or external memory device for use.

Here, a computer is a concept of a combination of hardware and an Operating System (OS), and means hardware which operates under control of the OS. Otherwise, if an application program operates hardware independently of an OS, the hardware corresponds to the computer. Hardware includes at least a microprocessor such as a CPU and means to read a computer program recorded in a recording medium. The above circuit simulator program (eye pattern generating program) includes a program code that instructs such a computer to achieve the functions of the elements 11-19. Part of the functions may be achieved by the OS, not by the application program.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. a non-transitory computer-readable recording medium in which a circuit simulator program of a simulation of a circuit using design data of the circuit is stored, the program instructing a computer to execute a process comprising:
    obtaining a number of longest continuous bits that continues a same value the longest in a test pattern previously set for generating an eye pattern of the circuit;
    simulating a rising step response to a rising step signal input into the circuit;
    simulating a falling step response to a falling step signal input into the circuit;
    analyzing a result of the simulating of the rising step response and the falling step response;
    generating, based on the number of longest continuous bits and a result of the analyzing the rising step response and the falling response, an upper part test pattern that defines a shape of an upper part of an eye of the eye pattern and a lower-part test pattern that defines a shape of a lower part of the eye of the pattern, wherein in the generating of the upper-part test pattern, the program instructs the computer to execute a process further comprising calculating, based on the result of the analyzing of the falling step response, a falling peak time width from a falling start time of the falling step response to a time when the falling step response reaches a minimum within a longest continuous bit time that is the product of the number of longest continuous bits and a time for one bit; and
    simulating a response to the upper-part test pattern and the lower-part test pattern both input into the circuit.

2. The non-transitory computer-readable recording medium according to claim 1, wherein:
    in the generating of the upper-part test pattern, the program instructs the computer to execute a process further comprising:
        calculating, based on the result of the analyzing of the falling step response, a falling peak time width from a falling start time of the falling step response to a time when the falling step response reaches a minimum within a longest continuous bit time that is the product of the number of longest continuous bits and a time for one bit;
        comparing the falling peak time width with the longest continuous bit time; and
        generating, if the falling peak time width is less than the longest continuous bit time, the upper-part test pattern so as to include a first pattern unit having continuous bits "0" as many as a number corresponding to the falling peak time width after one bit "1", or generating, if the falling peak time width is equal to or more than the longest continuous bit time, the upper-part test pattern so as to include a second pattern unit having continuous bits "0" as many as a number corresponding to the longest continuous bit time after one bit "1".

3. The non-transitory computer-readable recording medium according to claim 2, wherein, in the generating of the upper-part test pattern, the program instructs the computer to generate the upper-part test pattern so as to repeat the first or second pattern unit, which is corresponding to the result of the comparing, twice.

4. The non-transitory computer-readable recording medium according to claim 2, wherein, in the generating of the lower-part test pattern, the program instructs the computer to execute a process further comprising:
calculating, based on the result of the analyzing of the rising step response, a rising peak time width from a rising start time of the rising step response to a time when the rising step response reaches a maximum within the longest continuous bit time that is the product of the number of longest continuous bits and a time for one bit;
comparing the rising peak time width with the longest continuous bit time; and
generating, if the rising peak time width is less than the longest continuous bit time, the lower-part test pattern so as to include a third pattern unit having continuous bits "1" as many as a number corresponding to the rising peak time width after one bit "0", or generating, if the rising peak time width is equal to or more than the longest continuous bit time, the lower-part test pattern so as to include a fourth pattern unit having continuous bits "1" as many as a number corresponding to the longest continuous bit time after one bit "0".

5. The non-transitory computer-readable recording medium according to claim 4, wherein, in the generating of the lower-part test pattern, the program instructs the computer to execute generating the lower-part test pattern so as to repeat the third or fourth pattern unit, which is corresponding to the result of the comparing, twice.

6. The non-transitory computer-readable recording medium according to claim 2, wherein, in the analyzing the rising step response and the falling step response, the program further instructs the computer to execute a process further comprising:
calculating a step response analysis time by adding an input delay time of the rising step signal or the falling step signal, the longest continuous bit time, and a product of a propagating delay time from an input end to an observation point in the circuit and a predetermined value more than one; and
continuing the analyzing of the rising step response and the falling step response for the step response analysis time.

7. The non-transitory computer-readable recording medium according to claim 1, wherein the program further instructs the computer to execute a process further comprising:
checking an amount of reflection based on the result of the analyzing of the rising step response and the falling step response before the generating the upper-part test pattern and the lower-part test pattern; and
notifying, if the amount of reflection is determined to exceed an allowable value, the result of the determining to a user and finishing the simulation on the circuit, or generating, if the amount of reflection is determined to be the allowable value or less, the upper-part test pattern and the lower-part test pattern.

8. The non-transitory computer-readable recording medium according to claim 1, wherein the program further instructs the computer to execute a process further comprising:
simulating an output waveform from the circuit when the upper-part test pattern and the lower-part test pattern are each input into the circuit;
generating an upper-part eye pattern and a lower-part eye pattern from the output waveforms obtained by the simulating using the upper-part test pattern and the lower-part test pattern, respectively; and
generating the eye pattern of the circuit by combining the upper-part eye pattern and the lower-part eye pattern.

9. A device that executes a simulation of a circuit using design data of the circuit, the device comprising a processor that:
obtains a number of longest continuous bits that executes a same value the longest in a test pattern previously set for generating an eye pattern of the circuit;
simulates a rising step response to a rising step signal input into the circuit and a falling step response to a falling step signal input into the circuit;
analyzes a result of the simulating of the rising step response and the falling step response;
based on the number of longest continuous bits and a result of the analyzing the rising step response and the falling step response, an upper-part test pattern that defines a shape of an upper part of an eye of the eye pattern and a lower-part test pattern that defines a shape of a lower part of the eye of the eye pattern, wherein the processor calculates, based on the result of the analyzing of the falling step response, a falling peak time width from a falling start time of the falling step response to a time when the falling step response reaches a minimum within a longest continuous bit time that is the product of the number of longest continuous bits and a time for one bit; and
simulates the circuit using the upper-part test pattern and the lower part test pattern.

10. The device according to claim 9,
wherein the processor:
calculates, based on the result of the analyzing of the falling step response, a falling peak time width from a falling start time of the falling step response to a time when the falling step response reaches a minimum within a longest continuous bit time that is the product of the number of longest continuous bits and a time for one bit;
compares the falling peak time width with the longest continuous bit time; and
generates, if the falling peak time width is less than the longest continuous bit time, the upper-part test pattern so as to include a first pattern unit having continuous bits "0" as many as a number corresponding to the falling peak time width after one bit "1", or generates, if the falling peak time width is equal to or more than the longest continuous bit time, the upper-part test pattern so as to include a second pattern unit having continuous bits "0" as many as a number corresponding to the longest continuous bit time after one bit "1".

11. The device according to claim 10, wherein the processor generates the upper-part test pattern so as to repeat the first or second pattern unit, which is corresponding to the result of the comparing, twice.

12. The device according to claim 10, wherein the processor:
- calculates, based on the result of the analyzing of the rising step response, a rising peak time width from a rising start time of the rising step response to a time when the rising step response reaches a maximum within the longest continuous bit time that is the product of the number of longest continuous bits and a time for one bit;
- compares the rising peak time width with the longest continuous bit time; and
- generates, if the rising peak time width is less than the longest continuous bit time, the lower-part test pattern so as to include a third pattern unit having continuous bits "1" as many as a number corresponding to the rising peak time width after one bit "0", or generates, if the rising peak time width is equal to or more than the longest continuous bit time, the lower-part test pattern so as to include a fourth pattern unit having continuous bits "1" as many as a number corresponding to the longest continuous bit time after one bit "0".

13. The device according to claim 12, wherein the processor generates the lower-part test pattern so as to repeat the third or fourth pattern unit, which is corresponding to the result of the comparing, twice.

14. The device according to claim 10, wherein the processor:
- calculates a step response analysis time by adding an input delay time of the rising step signal or the falling step signal, the longest continuous bit time, and a product of a propagating delay time from an input end to an observation point in the circuit and a predetermined value more than one; and
- continues the analyzing of the rising step response and the falling step response for the step response analysis time.

15. The device according to claim 9, wherein the processor checks an amount of reflection based on the result of the analyzing of the rising step response and the falling step response before the test pattern generator generates the upper-part test pattern and the lower-part test pattern, and that notifies, if the amount of reflection is determined to exceed an allowable value, the result of the determining to a user and finishes the simulation on the circuit, or instructs, if the amount of reflection is determined to be the allowable value or less, the test pattern generator to generate the upper-part test pattern and the lower-part test pattern.

16. The device according to claim 9, wherein the processor:
- simulates an output waveform from the circuit when the upper-part test pattern and the lower-part test pattern are each input into the circuit;
- generates an upper-part eye pattern and a lower-part eye pattern from the output waveforms obtained by the simulating using the upper-part test pattern and the lower-part test pattern, respectively; and
- generates the eye pattern of the circuit by combining the upper-part eye pattern and the lower-part eye pattern.

17. A method of generating an eye pattern of a circuit through a simulation using a prescribed test pattern in a computer, the method comprising:
- obtaining a number of longest continuous bits that continues a same value the longest in the prescribed test pattern for generating an eye pattern of the circuit;
- analyzing a result of a rising step response to a rising step signal input into the circuit and a result of a falling step response to a falling step signal input into the circuit
- generating, based on a result of the analyzing the rising step response and the number of longest continuous bits, an upper-part test pattern that defines a shape of an upper part of an eye of the eye pattern, wherein the generating of the upper-part test pattern comprises calculating, based on the result of the analyzing of the falling step response, a falling peak time width from a falling start time of the falling step response to a time when the falling step response reaches a minimum within a longest continuous bit time that is the product of the number of longest continuous bits and a time for one bit; and
- generating, based on a result of the analyzing the falling step response and the number of longest continuous bits, a lower-part test pattern that defines a shape of a lower part of the eye of the eye pattern.

18. The method according to claim 17, wherein the generating of the upper-part test pattern comprises:
- calculating, based on the result of the analyzing of the falling step response, a falling peak time width from a falling start time of the falling step response to a time when the falling step response reaches a minimum within a longest continuous bit time that is the product of the number of longest continuous bits and a time for one bit;
- comparing the falling peak time width with the longest continuous bit time; and
- generating, if the falling peak time width is less than the longest continuous bit time, the upper-part test pattern so as to include a first pattern unit having continuous bits "0" as many as a number corresponding to the falling peak time width after one bit "1", or generating, if the falling peak time width is equal to or more than the longest continuous bit time, the upper-part test pattern so as to include a second pattern unit having continuous bits "0" as many as a number corresponding to the longest continuous bit time after one bit "1".

19. The method according to claim 17, wherein the generating of the lower-part test pattern comprises:
- calculating, based on the result of the analyzing of the rising step response, a rising peak time width from a rising start time of the rising step response to a time when the rising step response reaches a maximum within the longest continuous bit time that is the product of the number of longest continuous bits and a time for one bit;
- comparing the rising peak time width with the longest continuous bit time; and
- generating, if the rising peak time width is less than the longest continuous bit time, the lower-part test pattern so as to include a third pattern unit having continuous bits "1" as many as a number corresponding to the rising peak time width after one bit "0", or generating, if the rising peak time width is equal to or more than the longest continuous bit time, the lower-part test pattern so as to include a fourth pattern unit having continuous bits "1" as many as a number corresponding to the longest continuous bit time after one bit "0".

20. The method according to claim 17, further comprising:
- checking an amount of reflection based on the result of the analyzing of the rising step response and the falling step response before the generating of the upper-part test pattern and the lower-part test pattern; and
- notifying, if the amount of reflection is determined to exceed an allowable value, the result of the determining to a user and finishing the simulation on the circuit, or generating, if the amount of reflection is determined to be the allowable value or less, the upper-part test pattern and the lower-part test pattern.

* * * * *